US012786597B2

(12) United States Patent
Shigiya et al.

(10) Patent No.: US 12,786,597 B2
(45) Date of Patent: Nov. 3, 2026

(54) PHOTOELECTRIC CONVERSION DEVICE AND APPARATUS

(71) Applicant: CANON KABUSHIKI KAISHA, Tokyo (JP)

(72) Inventors: Yoshiko Shigiya, Tokyo (JP); Noriyuki Shikina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 45 days.

(21) Appl. No.: 19/068,138

(22) Filed: Mar. 3, 2025

(65) Prior Publication Data

US 2025/0280213 A1 Sep. 4, 2025

(30) Foreign Application Priority Data

Mar. 4, 2024 (JP) ................................ 2024-032522

(51) Int. Cl.
*H04N 25/78* (2023.01)
*H10F 77/40* (2025.01)

(52) U.S. Cl.
CPC ........... *H04N 25/78* (2023.01); *H10F 77/413* (2025.01)

(58) Field of Classification Search
CPC ........ H04N 25/78; H10F 77/413; H10F 30/22
See application file for complete search history.

(56) References Cited

U.S. PATENT DOCUMENTS 10,389,964 B2 8/2019 Taniguchi
10,645,316 B2 5/2020 Shigiya
10,659,713 B2 5/2020 Shikina
11,202,023 B2 12/2021 Shigiya
11,303,829 B2 4/2022 Shigiya
11,490,041 B2 11/2022 Shigiya
11,595,606 B2 2/2023 Shikina
11,627,264 B2 4/2023 Igarashi
(Continued)

FOREIGN PATENT DOCUMENTS

JP 2019-102947 A 6/2019
JP 2021-153255 A 9/2021
(Continued)

OTHER PUBLICATIONS

U.S. Appl. No. 18/958,195, filed Nov. 25, 2024 (First Named Inventor: Tomoya Kokado).
(Continued)

*Primary Examiner* — Xi Wang
(74) *Attorney, Agent, or Firm* — Venable LLP

(57) ABSTRACT

A photoelectric conversion device is provided. The device includes pixels each including first and second converters and a row selector. A holding unit and an AD converter are arranged for each column. The holding unit includes a holding circuit to receive signals from pixels via output lines and a selector. The row selector causes at least two pixels that are connected to different output lines and arranged on different rows to output first signals based on a signal of the first converter, and then output second signals based on signals of the first and second converter. The selector selects the first and second signals that are held by the holding circuit and outputs them to the AD converter, and a number of first signals output to the AD converter is smaller than a number of first signals supplied to the holding circuit.

16 Claims, 18 Drawing Sheets

(56) References Cited

U.S. PATENT DOCUMENTS

| | | | |
|---|---|---|---|
| 11,700,467 B2 | 7/2023 | Shikina | |
| 11,758,296 B2 | 9/2023 | Shikina | |
| 12,088,933 B2 | 9/2024 | Shimada | |
| 2017/0019584 A1* | 1/2017 | Ham | H04N 23/672 |
| 2017/0338262 A1 | 11/2017 | Hirata | |
| 2019/0165014 A1 | 5/2019 | Wada | |
| 2021/0306577 A1 | 9/2021 | Shigiya | |
| 2023/0282654 A1 | 9/2023 | Kobayashi | |
| 2024/0111146 A1 | 4/2024 | Matsuyama | |
| 2024/0155268 A1 | 5/2024 | Shigiya | |
| 2024/0241230 A1 | 7/2024 | Matsuyama | |
| 2024/0406587 A1 | 12/2024 | Shimada | |

FOREIGN PATENT DOCUMENTS

| | | |
|---|---|---|
| JP | 2023-127108 A | 9/2023 |
| WO | 2016/076126 A1 | 5/2016 |

OTHER PUBLICATIONS

U.S. Appl. No. 19/038,854, filed Jan. 28, 2025 (First Named Inventor: Momonosuke Odani).

* cited by examiner

PHOTOELECTRIC CONVERSION DEVICE AND APPARATUS

BACKGROUND OF THE INVENTION

Field of the Invention

The present disclosure relates to a photoelectric conversion device and an apparatus.

Description of the Related Art

In Japanese Patent Laid-Open No. 2021-153255, high-speed shooting is requested of a photoelectric conversion device that obtains both a focus detection signal and an image generation signal. To achieve speeding up, it is considered to increase the number of rows on which signals are analog-to-digital (A/D)-converted at the same time in one horizontal period, or shorten one horizontal period. Japanese Patent Laid-Open No. 2021-153255 discloses a technique in which some of focus detection data A/D-converted at the same time during one horizontal period are not output so as to shorten one horizontal period.

SUMMARY OF THE INVENTION

A photoelectric conversion device needs to achieve not only high-speed shooting, but also high-precision focus detection and reduction of power consumption.

Some embodiments of the present disclosure provide a technique advantageous for improving the performance of a photoelectric conversion device.

According to some embodiments, a photoelectric conversion device comprising: a plurality of pixels arranged to constitute a plurality of rows and a plurality of columns; a plurality of output lines; and a row selector configured to select, from the plurality of pixels, a pixel that outputs a signal, wherein a signal holding unit, and a converter configured to convert an analog signal output from the signal holding unit into a digital signal are arranged for each column of the plurality of columns, the signal holding unit includes a holding circuit configured to receive signals from pixels connected to at least two output lines out of the plurality of pixels via, out of the plurality of output lines, the at least two output lines assigned to the column on which the signal holding unit is arranged, and a selection circuit, each of the plurality of pixels includes a first photoelectric converter and a second photoelectric converter, the row selector causes at least two pixels that are connected to different output lines out of the at least two output lines and arranged on different rows out of the plurality of rows, to output first analog signals based on a signal of the first photoelectric converter, and then output second analog signals based on a signal of the first photoelectric converter and a signal of the second photoelectric converter, the selection circuit selects the first analog signals and the second analog signals that are held by the holding circuit, and outputs the first analog signals and the second analog signals to the converter, and a number of first analog signals output by the selection circuit to the converter is smaller than a number of first analog signals supplied to the holding circuit, is provided.

Further features of the present invention will become apparent from the following description of exemplary embodiments (with reference to the attached drawings).

DESCRIPTION OF THE EMBODIMENTS

Figure 1:
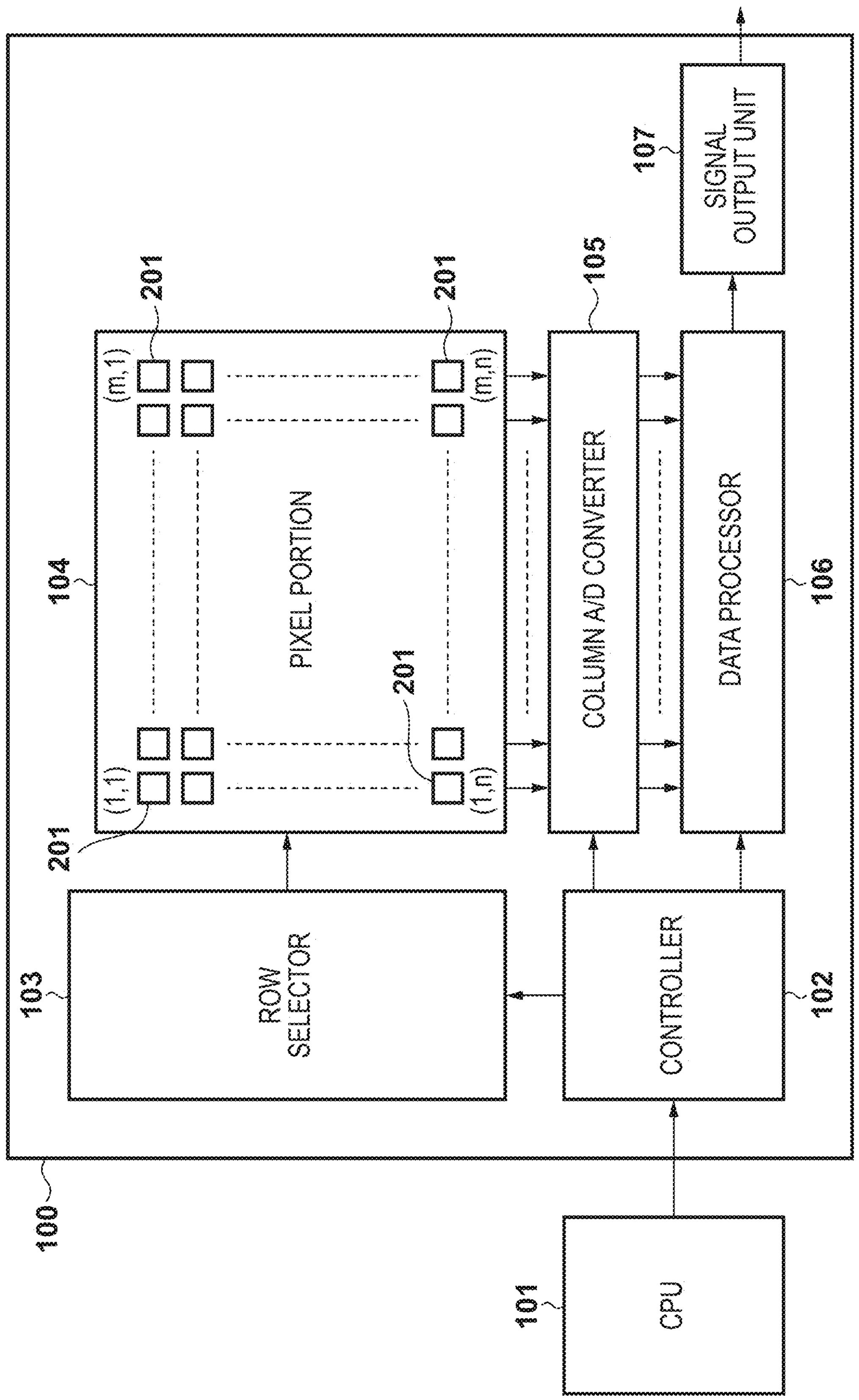
FIG. 1 is a block diagram showing an example of the arrangement of a photoelectric conversion device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A photoelectric conversion device according to an embodiment of the present disclosure will be explained with reference to FIGS. 1 to 9. FIG. 1 is a block diagram showing an example of the arrangement of a photoelectric conversion device 100 according to the present disclosure. The photoelectric conversion device 100 is controlled by, for example, a CPU 101 arranged outside the photoelectric conversion device 100. The photoelectric conversion device 100 can include a controller 102, a row selector 103, a pixel portion 104, a column analog-to-digital (A/D) converter 105, a data processor 106, and a signal output unit 107. The controller 102 receives a sync signal and a control signal that are supplied from the CPU 101, and controls components within the photoelectric conversion device 100. At the pixel portion 104, a plurality of pixels 201 are so arranged as to constitute a plurality of rows and a plurality of columns. In the arrangement shown in FIG. 1, the pixels 201 are arranged in a n×m matrix. In accordance with a control signal supplied from the controller 102, the row selector 103 selects, from the pixels 201, a pixel that outputs a signal. In accordance with a control signal supplied from the controller 102, the column A/D converter 105 converts an analog signal output from the pixel portion 104 into a digital signal. In accordance with a control signal supplied from the controller 102, the data processor 106 performs signal processing such as correction processing on the signal output from the column A/D converter 105. The signal output unit 107 can be an interface for outputting a signal to outside the photoelectric conversion device 100.

Figure 2:
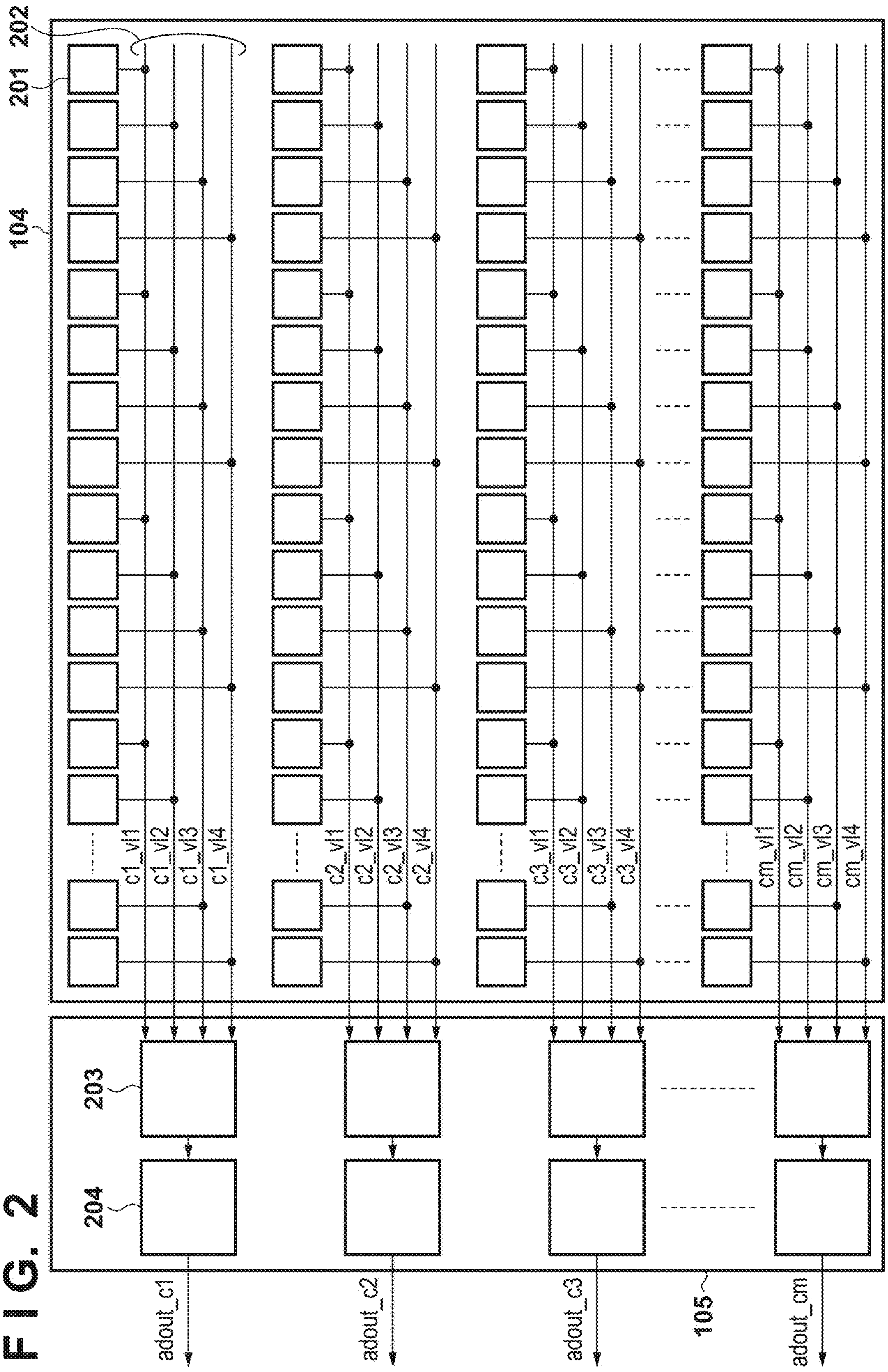
FIG. 2 is a schematic view showing an example of the arrangements of the pixel portion and peripheral circuit of the photoelectric conversion device in FIG. 1.

FIG. 2 is a schematic view showing an example of the arrangements of the pixel portion 104 and column A/D converter 105 according to the embodiment. At the pixel portion 104, the plurality of pixels 201 are arranged. Also, at the pixel portion 104, a plurality of output lines 202 are so arranged as to assign two or more output lines 202 for each of a plurality of columns on which the pixels 201 are aligned. In the arrangement shown in FIG. 2, four output lines are arranged for each column. The output lines 202 are connected to a constant current source (not shown).

In the arrangement shown in FIG. 2, the pixel 201 on the first column and the first row is connected to c1_vl1 out of the output lines 202, and the pixel 201 on the first column and the second row is connected to c1_vl2 out of the output lines 202. Similarly, the pixels 201 are connected to corresponding output lines 202 in a cycle of four rows. In FIG. 2, four output lines 202 connected to the pixels 201 on the first column are expressed as c1_*vl*# (#: 1 to 4), and four output lines 202 connected to the pixels 201 on the mth column are expressed as cm_vl#.

The output lines 202 are connected to the column A/D converter 105. In the column A/D converter 105, signal holding units 203 and converters 204 are arranged for each of a plurality of columns on which the pixels 201 are aligned. Each converter 204 converts an analog signal output from the corresponding signal holding unit 203 into a digital signal.

Figure 3:
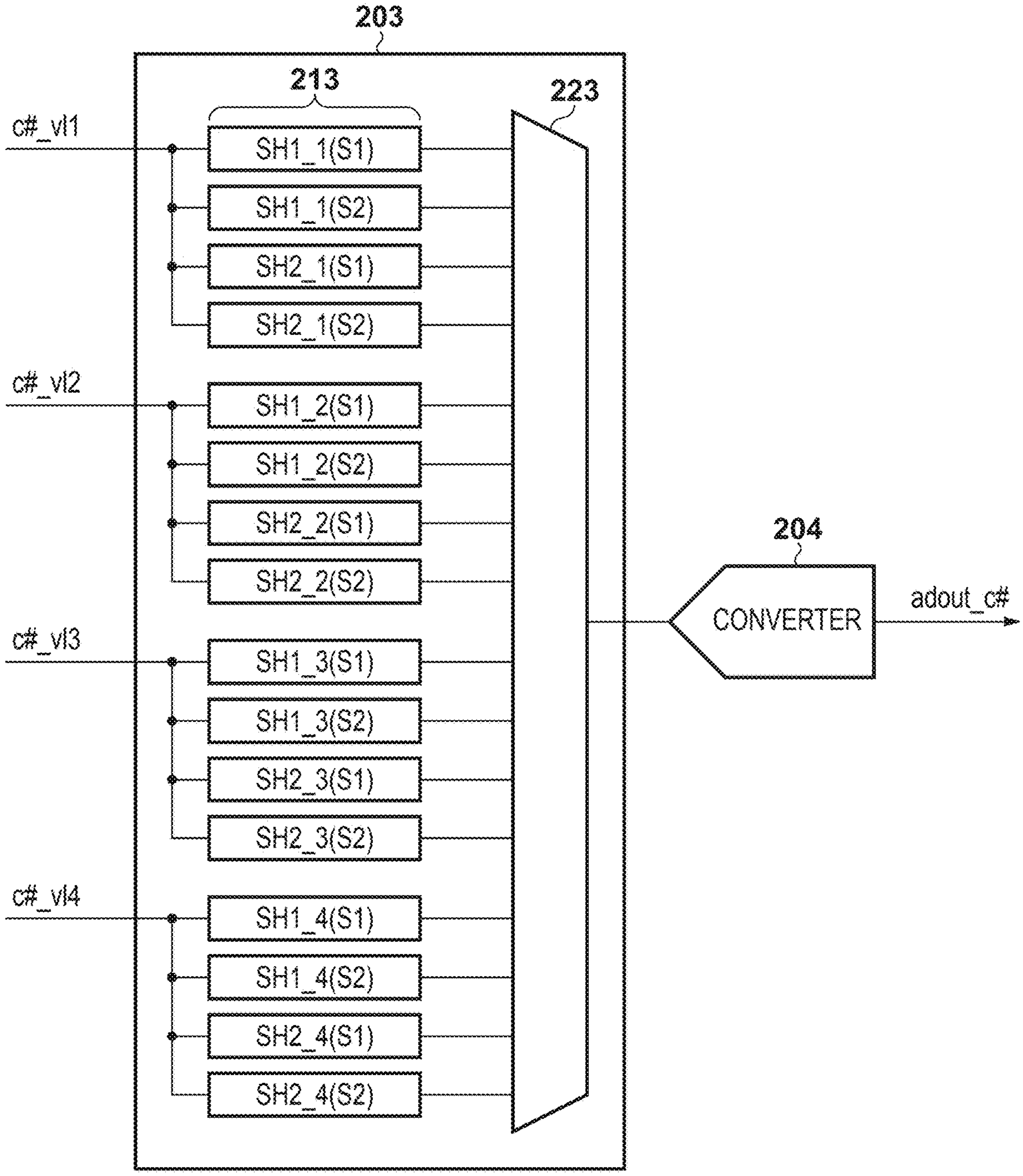
FIG. 3 is a diagram showing an example of the arrangement of the signal holding unit of the photoelectric conversion device in FIG. 1.

As shown in FIG. 3, the signal holding unit 203 includes holding circuits 213 and a selection circuit 223. Each holding circuit 213 receives signals from, out of the plurality of pixels 201, the pixels 201 connected to the corresponding output lines 202 via, out of the plurality of output lines 202, two or more output lines (four in the arrangement shown in FIG. 2) assigned to a column on which the holding circuit 213 is arranged. The selection circuit 223 selects analog signals held by the holding circuits 213 and outputs them to the converter 204.

In the embodiment, the converters 204 are arranged one by one on respective columns. Each converter 204 A/D-converts an analog signal output from the selection circuit 223 out of analog signals output to the signal holding unit 203 via the output lines 202 (in the case of the first pixel column, c1_vl1, c1_vl2, c1_vl3, and c1_vl4). For example, A/D conversion is repeated four times to convert analog signals output from the pixels 201 arranged on the first column and the first to fourth rows into digital signals. Signals output from the converter 204 are supplied to the data processor 106 via a signal line adout_cm. Note that a signal output from the converter 204 is digital data and is a signal of a plurality of bits.

Figure 4:
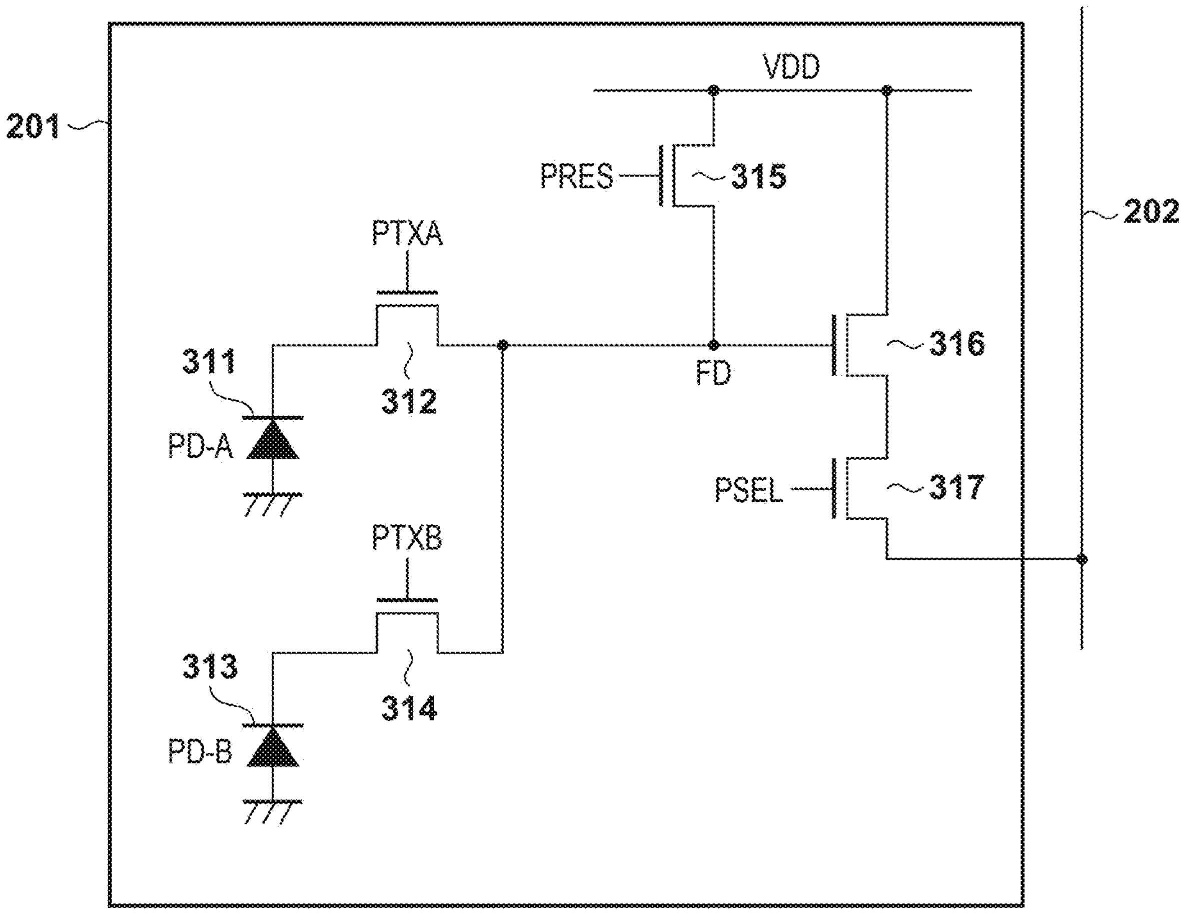
FIG. 4 is a circuit diagram showing an example of the arrangement of the pixel of the photoelectric conversion device in FIG. 1.

FIG. 4 is a circuit diagram showing an example of the arrangement of the pixel 201. Each of the pixels 201 arranged at the pixel portion 104 includes a photoelectric converter 311 and a photoelectric converter 313. Further, the pixel 201 includes a charge transfer unit 312 that transfers charges accumulated in the photoelectric converter 311, and a charge transfer unit 314 that transfers charges accumulated in the photoelectric converter 313. The pixel 201 also includes a floating diffusion portion FD, a reset portion 315, a signal amplifier 316, and a selector 317.

The photoelectric converters 311 and 313 convert incident light into charges. For example, the photoelectric converters 311 and 313 can be constituted using elements such as photodiodes.

The charge transfer unit 312 is arranged on an electrical path between the photoelectric converter 311 and the floating diffusion portion FD. The charge transfer unit 314 is arranged on an electrical path between the photoelectric converter 313 and the floating diffusion portion FD. The charge transfer unit 312 can be a transfer transistor that reads out charges accumulated in the photoelectric converter 311. Conduction/non-conduction (ON/OFF) of the charge transfer unit 312 is controlled by a pixel transfer signal PTXA. Similarly, the charge transfer unit 314 can be a transfer transistor that reads out charges accumulated in the photoelectric converter 313. Conduction/non-conduction (ON/OFF) of the charge transfer unit 314 is controlled by a pixel transfer signal PTXB.

The reset portion 315 is arranged on an electrical path between the floating diffusion portion FD and a wiring pattern to which a power supply voltage VDD is supplied. The reset portion 315 can be a reset transistor that supplies the power supply voltage VDD to the floating diffusion portion FD to reset the potential of the floating diffusion portion FD. Conduction/non-conduction (ON/OFF) of the reset portion 315 is controlled by a pixel portion reset signal PRES.

The gate of the signal amplifier 316 is connected to the floating diffusion portion FD. Either of the drain and source of the signal amplifier 316 is connected to the power supply voltage VDD, and the other is connected to the selector 317. The signal amplifier 316 is a source follower that converts charges of the floating diffusion portion FD into a voltage, and outputs the voltage to the output line 202. The signal amplifier 316 can be constituted by, for example, a transistor.

The selector 317 is arranged on an electrical path between the output of the signal amplifier 316 and the output line 202. The selector 317 is a transistor for selecting a pixel row that outputs a signal. Conduction/non-conduction (ON/OFF) of the selector 317 is controlled by a row selection signal PSEL.

Figure 5:
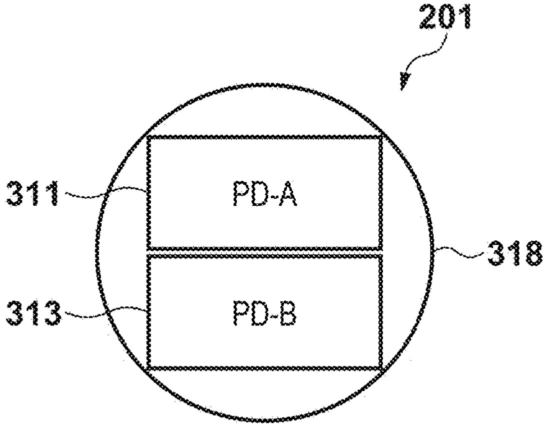
FIG. 5 is a view showing an example of the arrangement of the pixel of the photoelectric conversion device in FIG. 1.

FIG. 5 is a schematic plan view of the pixel 201. In each of the pixels 201 arranged at the pixel portion 104, the photoelectric converters 311 and 313 share one microlens 318. In other words, the photoelectric converters 311 and 313 are arranged in correspondence with one microlens 318. That is, the photoelectric converters 311 and 313 receive light having passed through one microlens 318.

Figure 6:
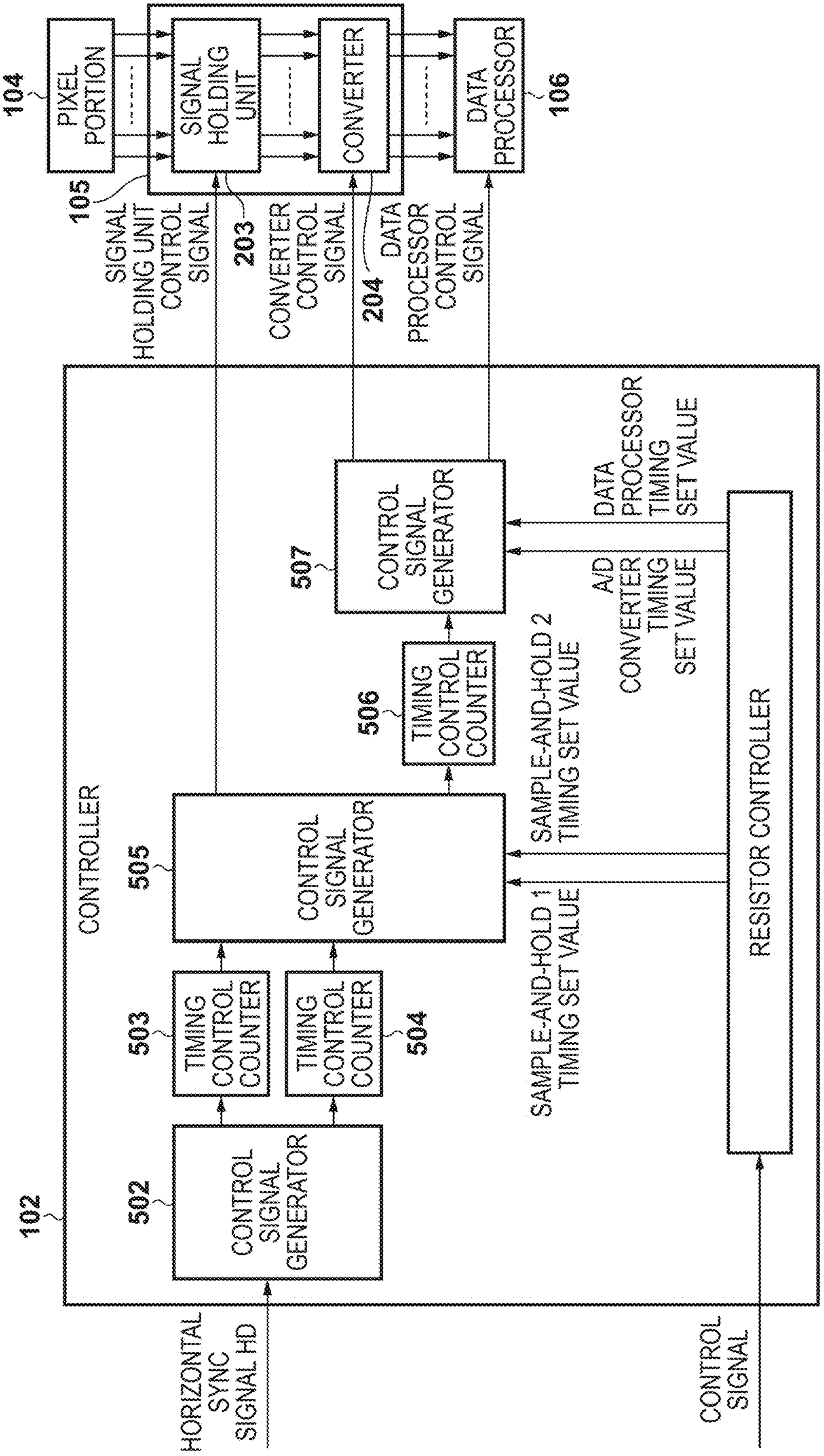
FIG. 6 is a block diagram showing an example of the arrangement of the controller of the photoelectric conversion device in FIG. 1.
Figure 7A:
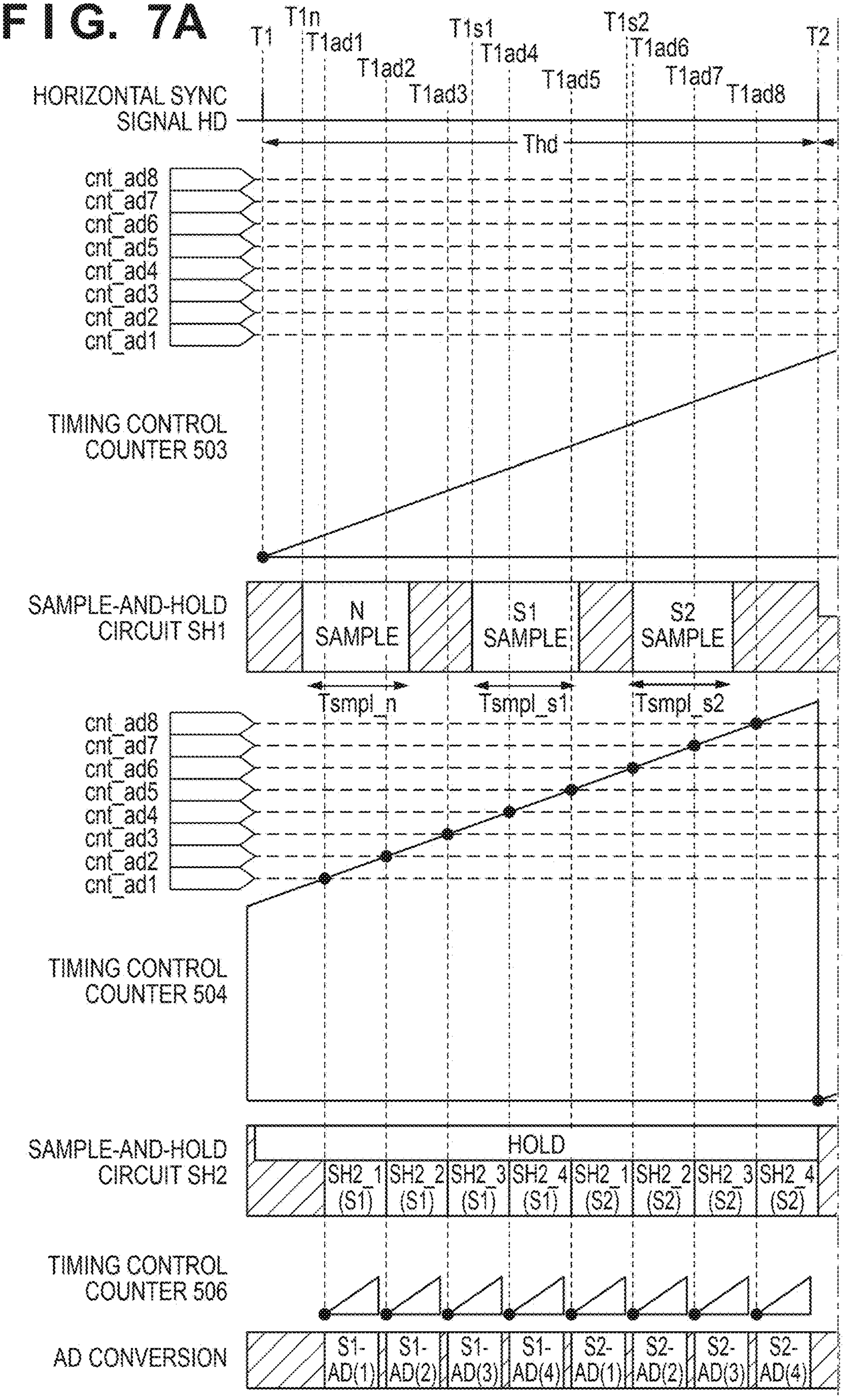
FIGS. 7A to 7D are timing charts showing an example of the operation of the photoelectric conversion device in FIG. 1.
Figure 7B:
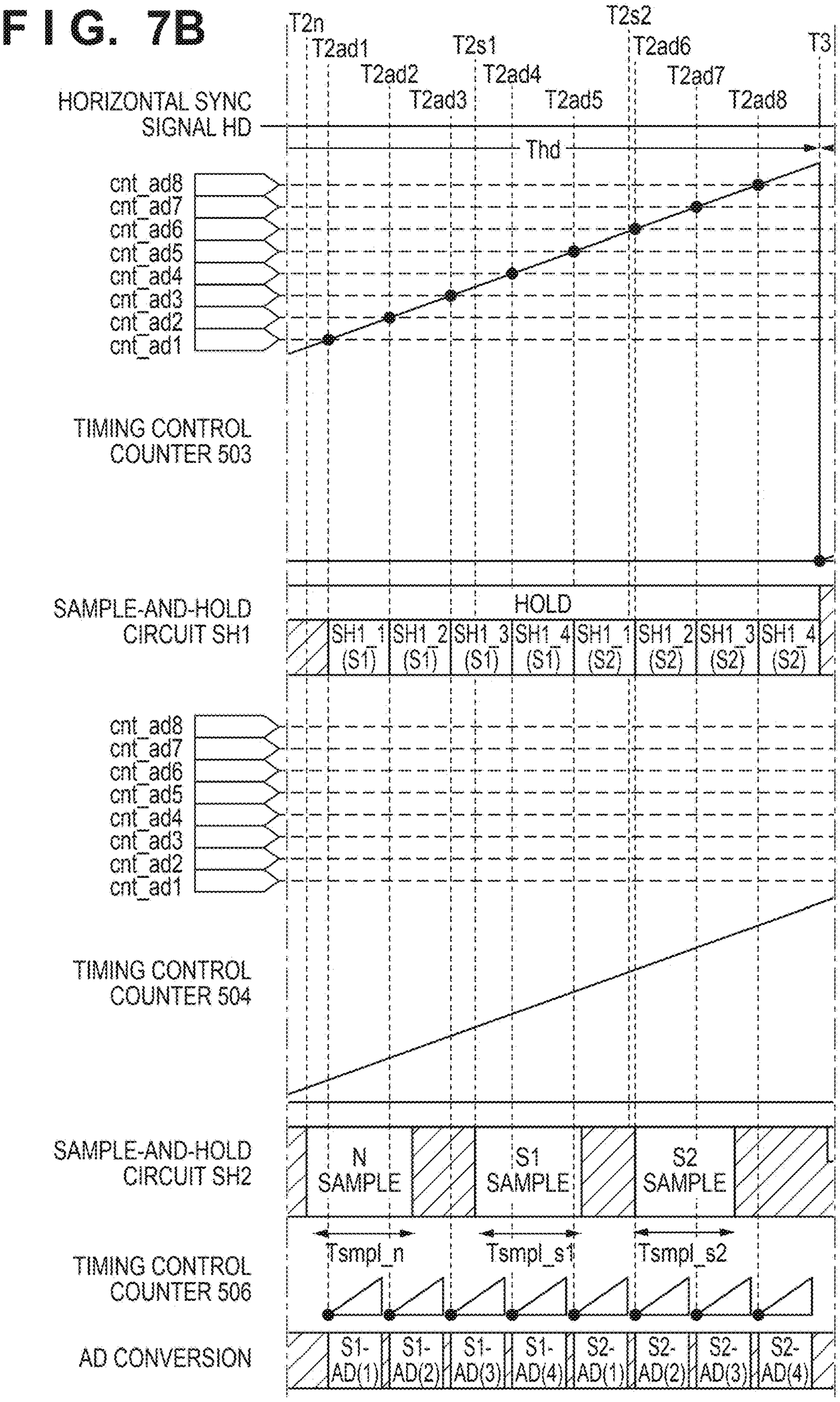
Figure 7C:
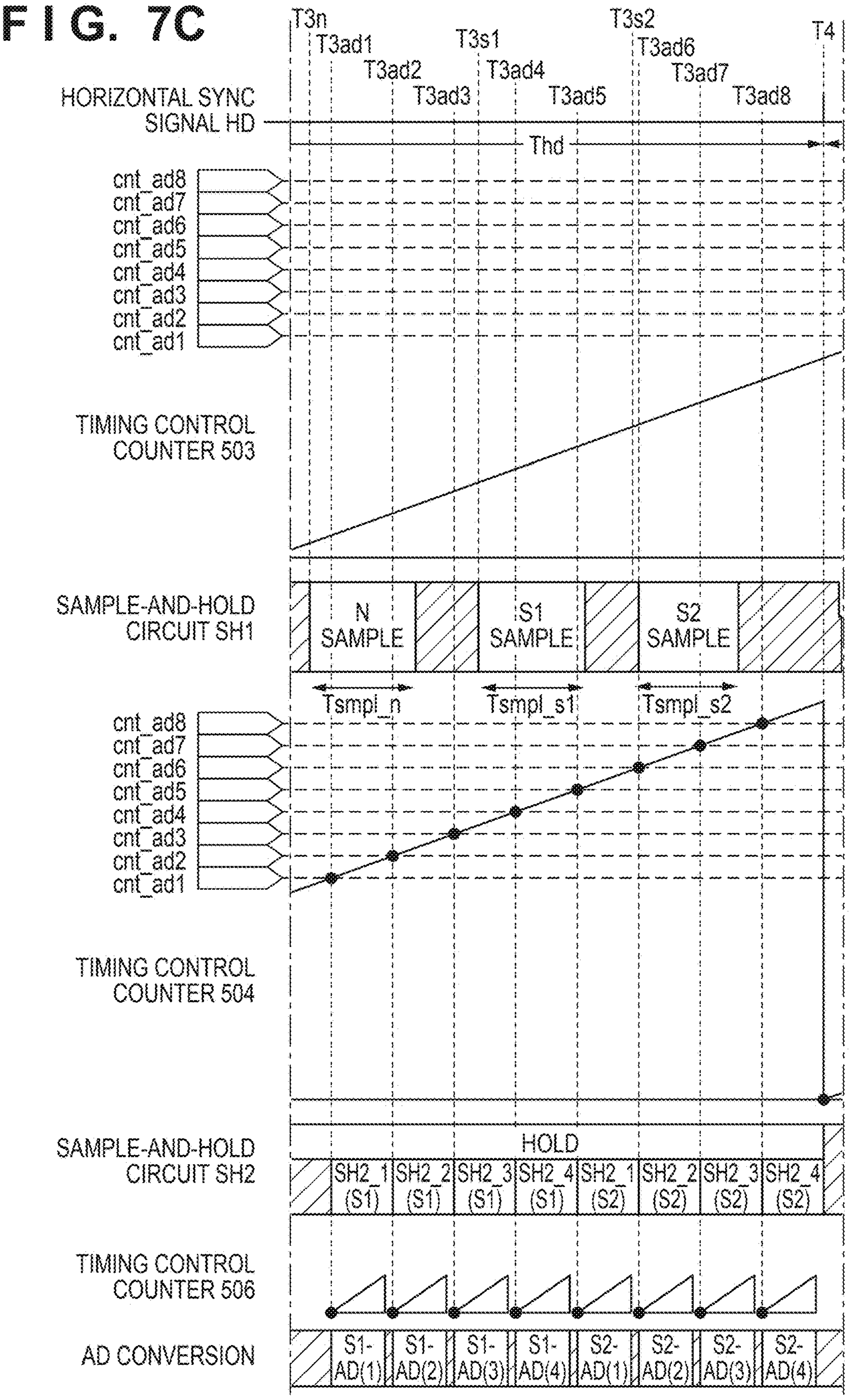
Figure 7D:
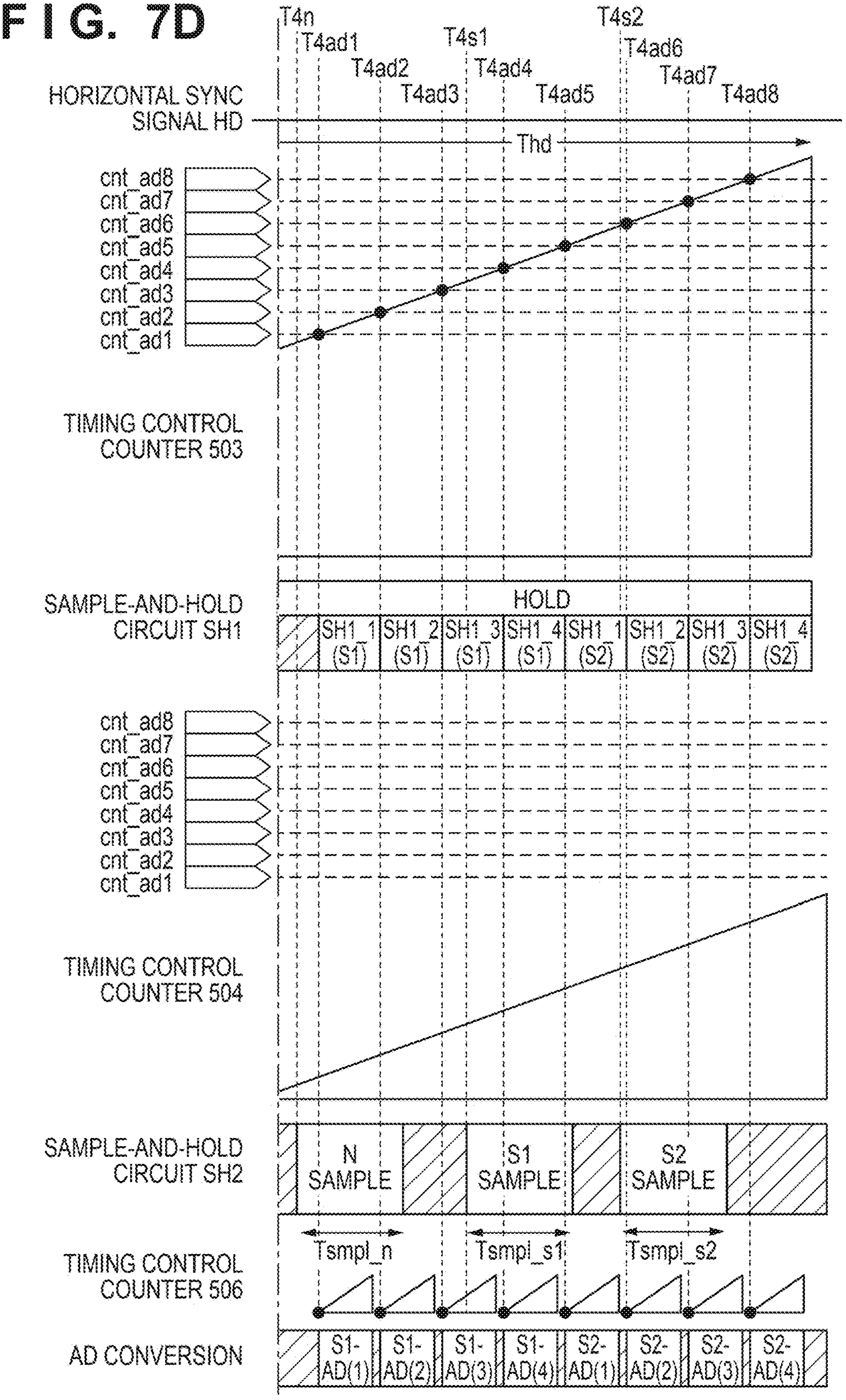
Figure 8A:
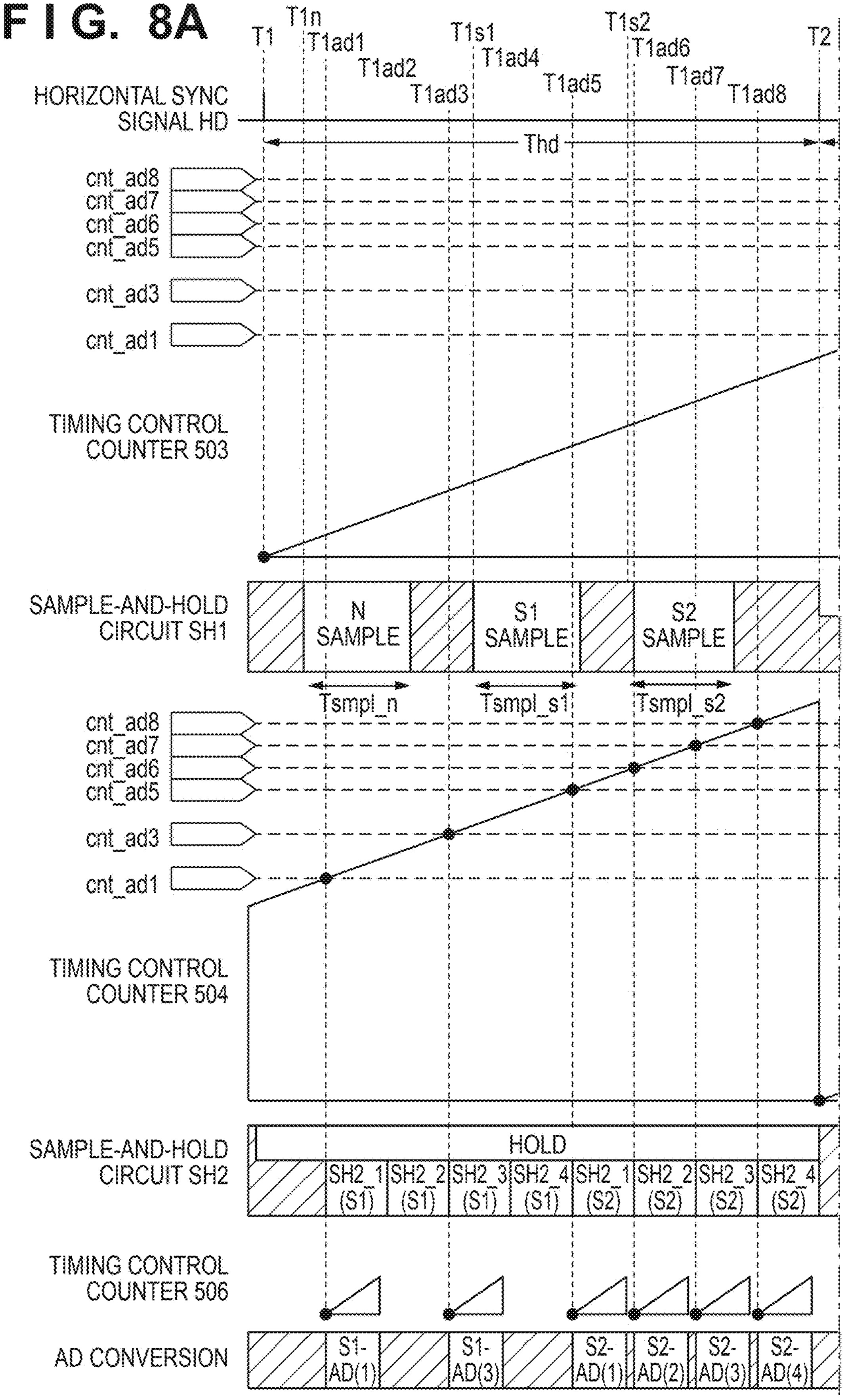
FIGS. 8A to 8D are timing charts showing an example of the operation of the photoelectric conversion device in FIG. 1.
Figure 8B:
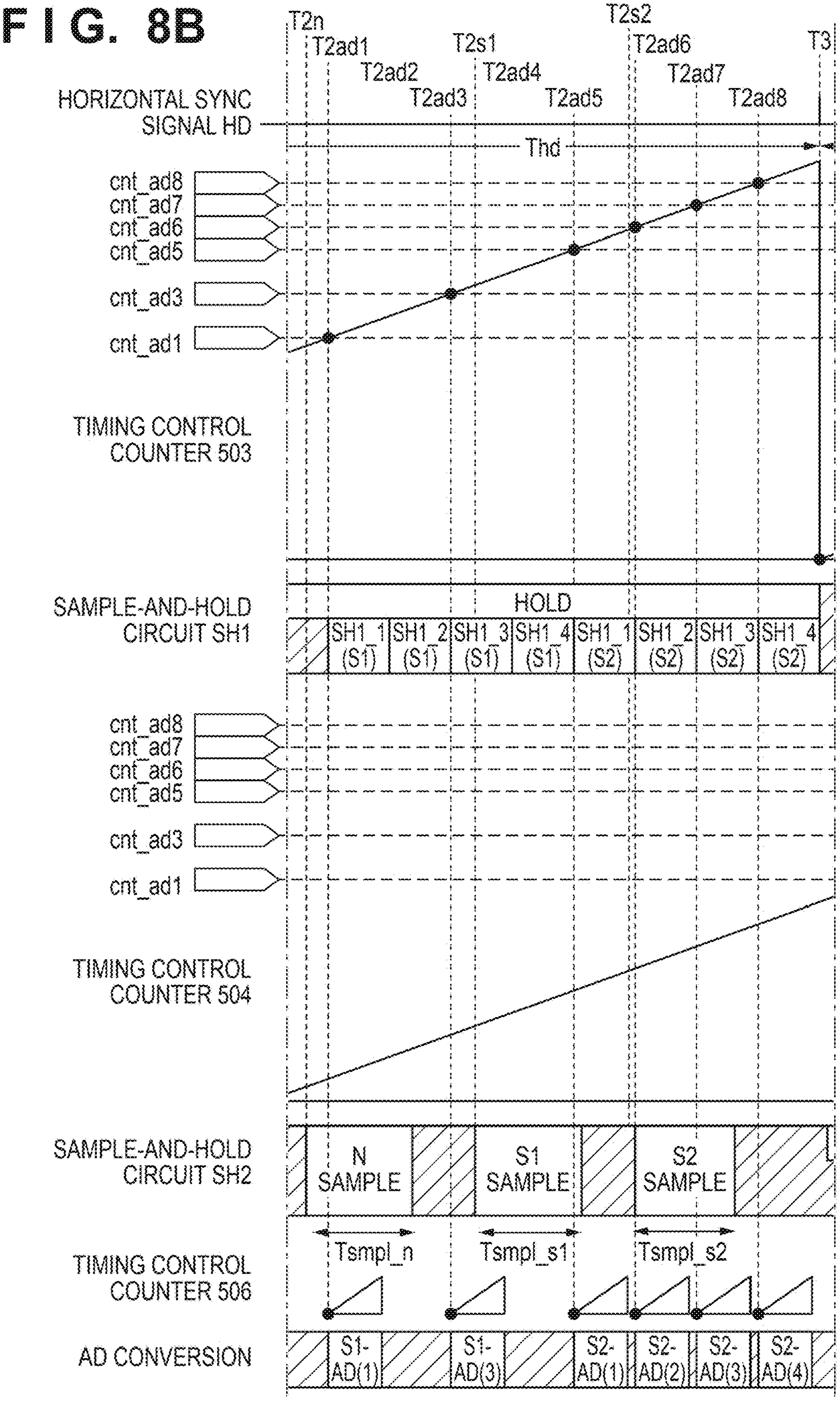
Figure 8C:
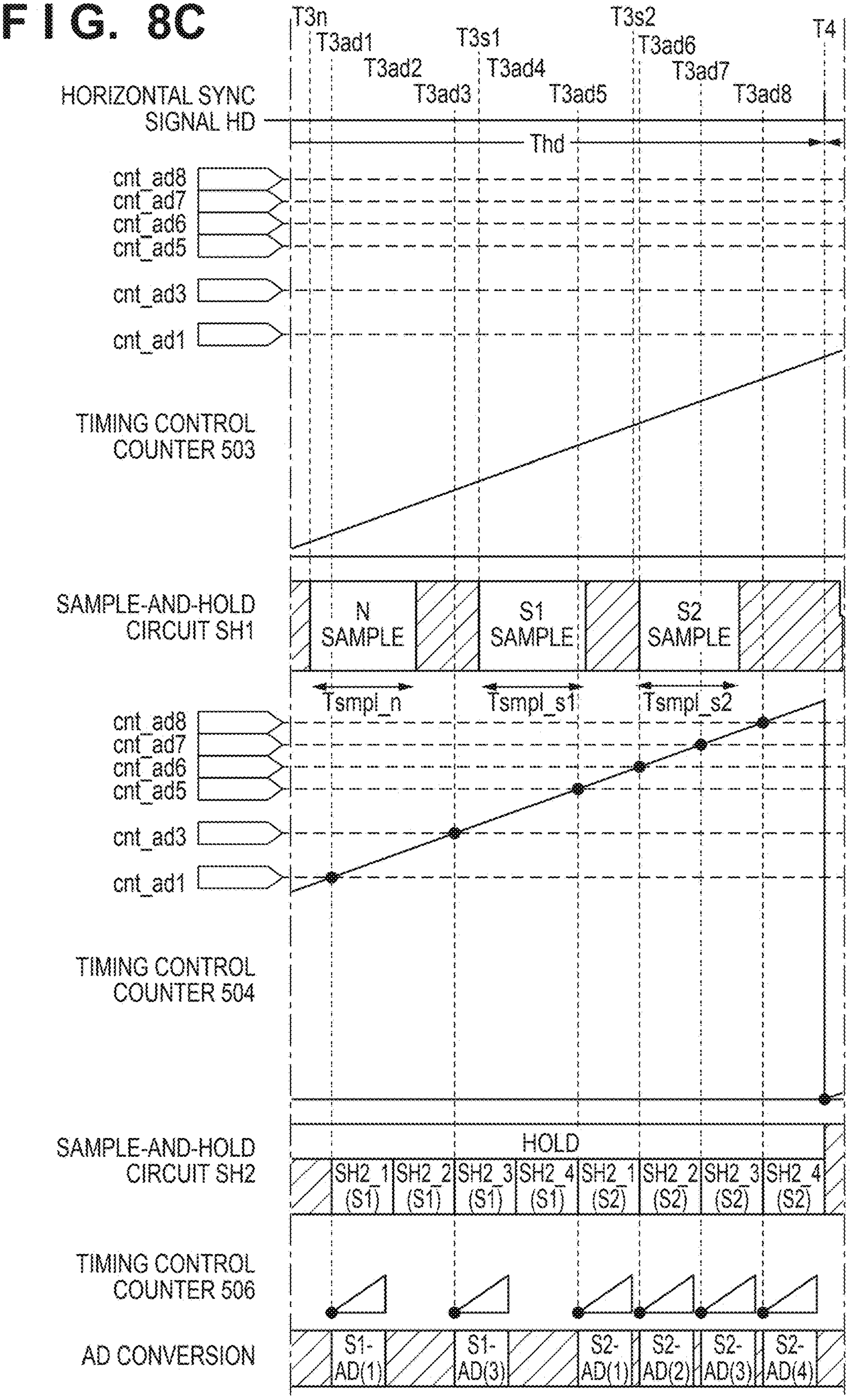
Figure 8D:
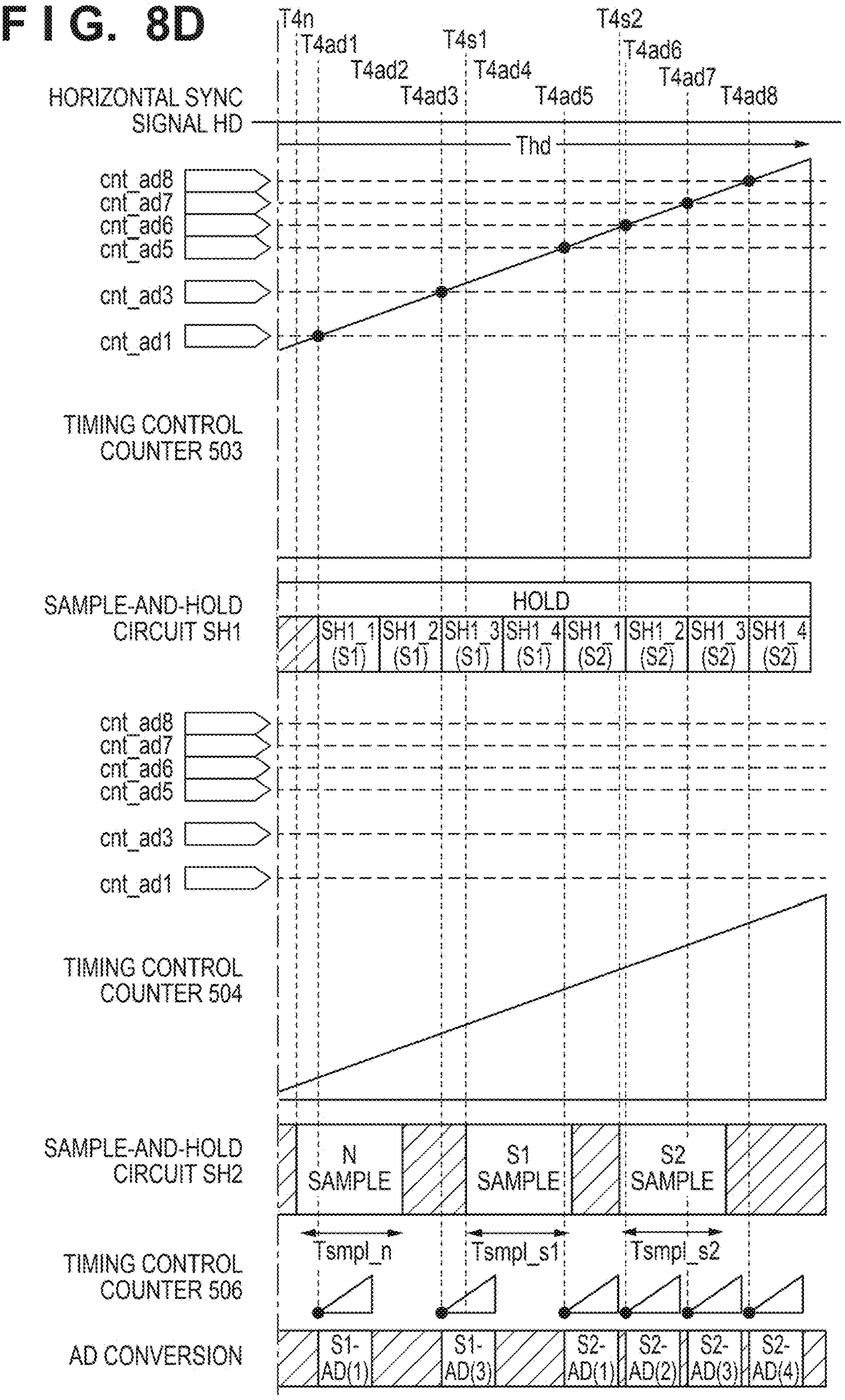
Figure 9A:
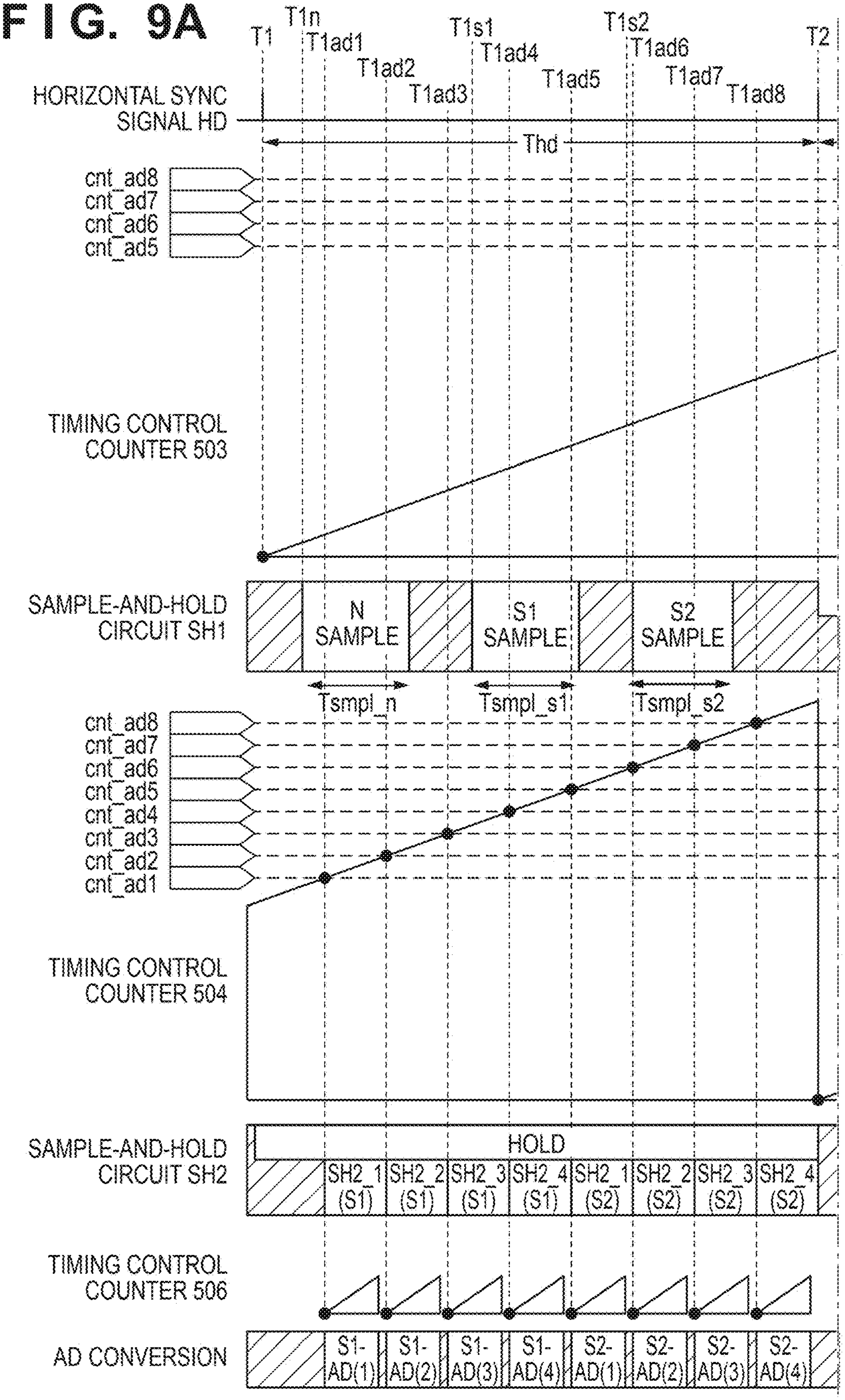
FIGS. 9A to 9D are timing charts showing an example of the operation of the photoelectric conversion device in FIG. 1.
Figure 9B:
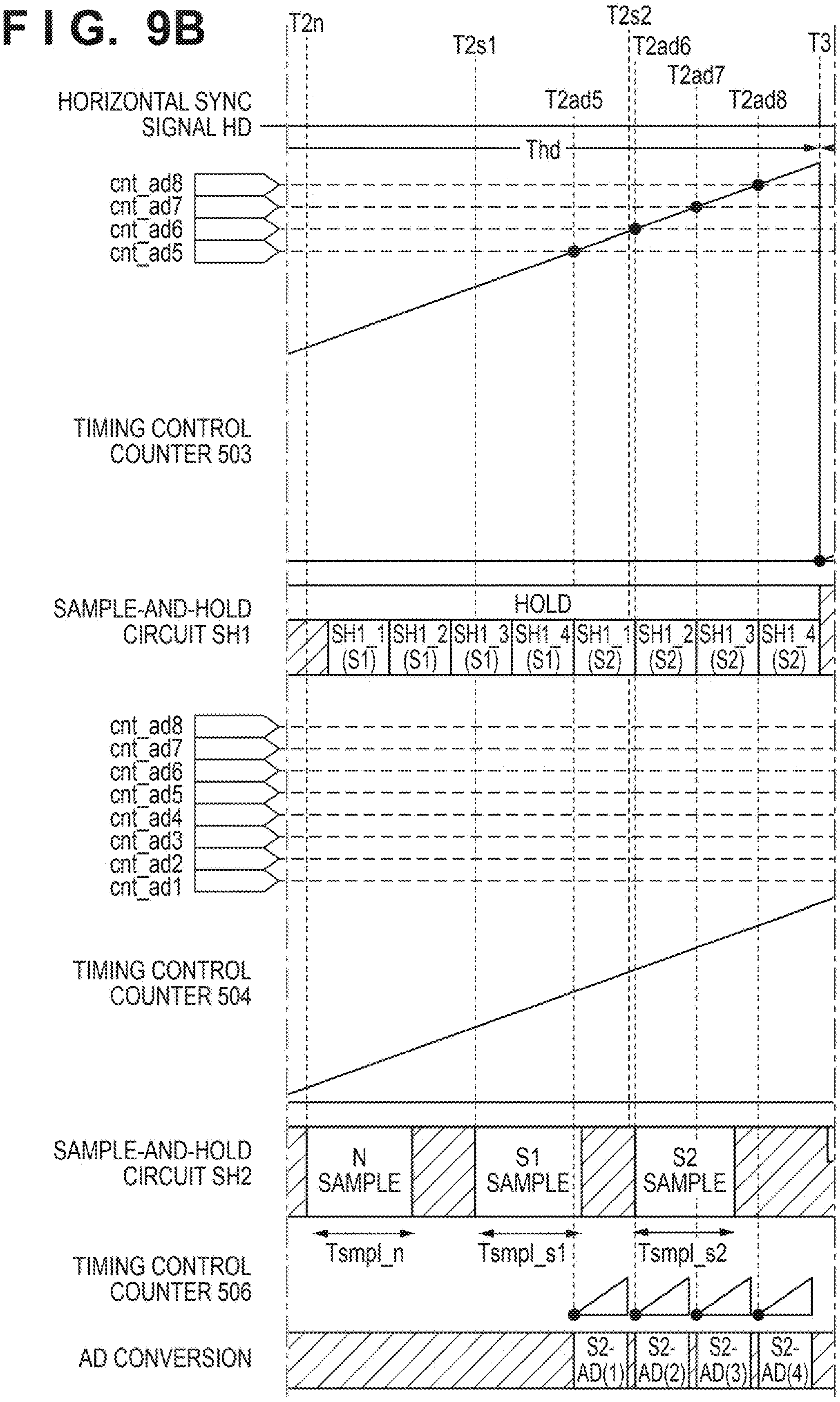
Figure 9C:
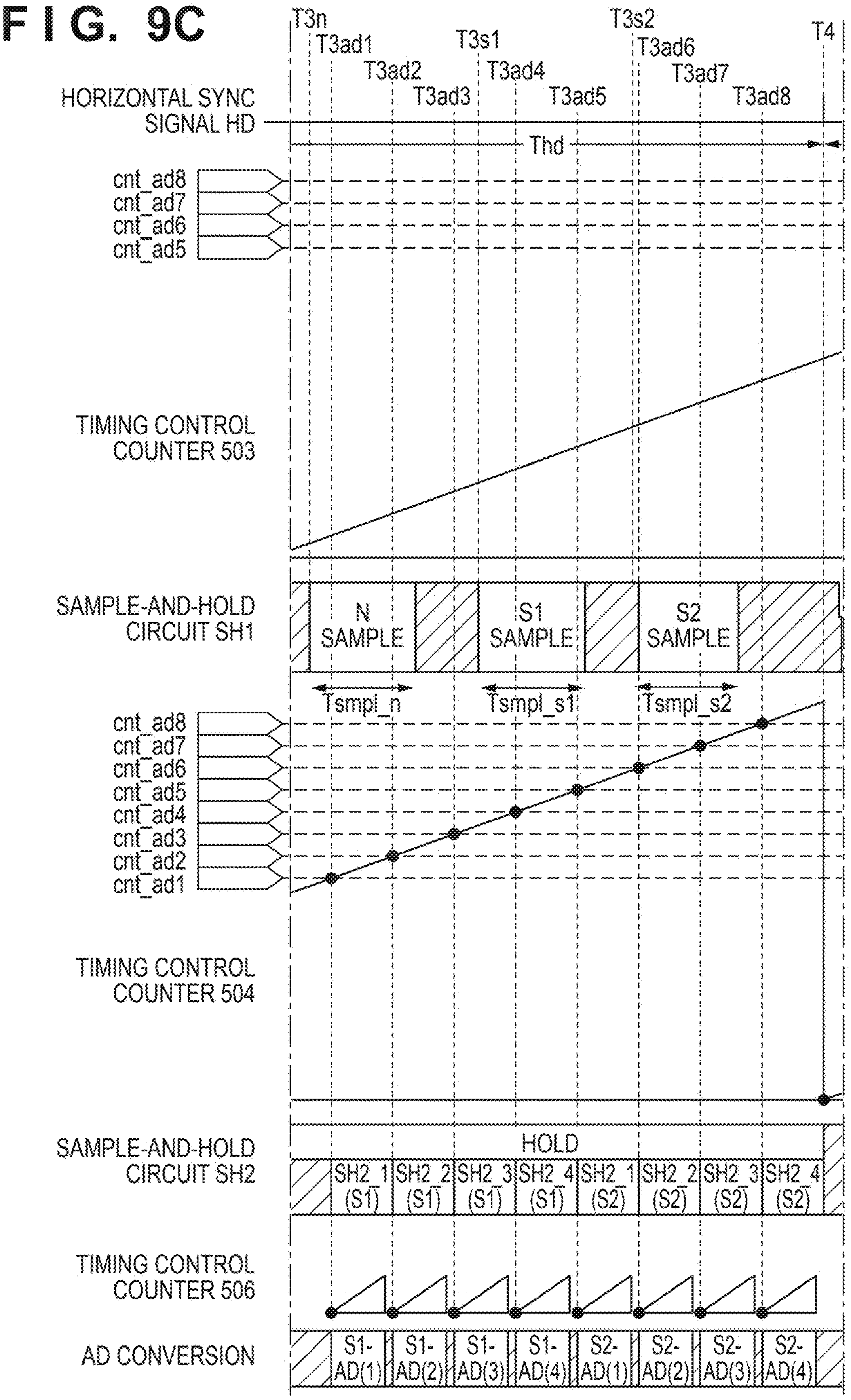
Figure 9D:
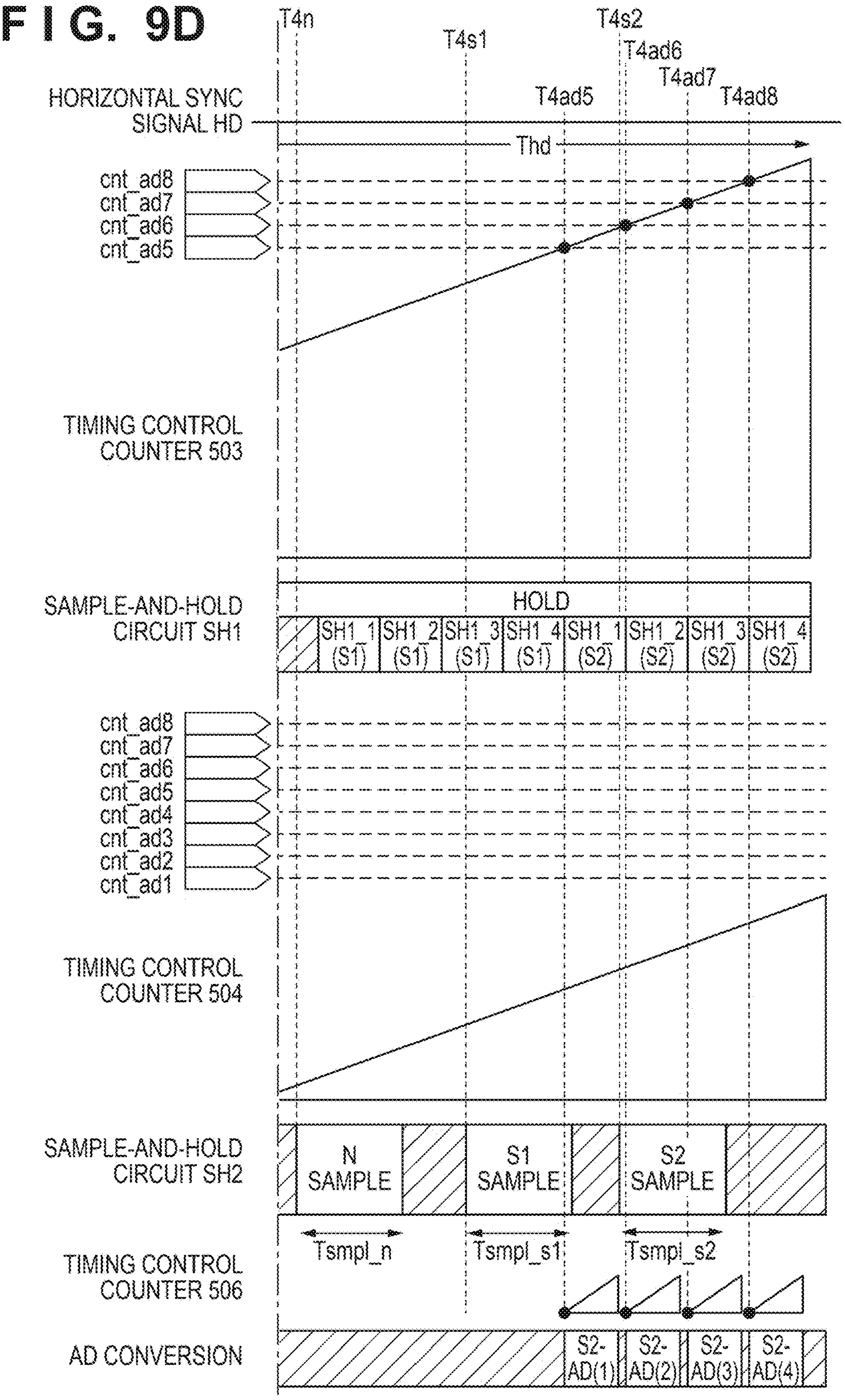

FIG. 6 is a block diagram showing an example of the arrangement of the controller 102 according to the embodiment. The controller 102 can include a resistor controller 501, control signal generators 502, 505, and 507, and timing control counters 503, 504, and 506. The resistor controller 501 holds various set values set by a control signal supplied from the CPU 101. Based on a horizontal sync signal HD supplied from the CPU 101, the control signal generator 502 generates a control signal that controls the timing control counters 503 and 504. The timing control counters 503 and 504 operate based on the horizontal sync signal HD in accordance with the control signal supplied from the control signal generator 502. The timing control counter 503 is used to control some of the holding circuits 213 in the signal holding unit 203. The timing control counter 504 is used to control other holding circuits 213 in the signal holding unit 203.

The control signal generator 505 generates a control signal that controls the signal holding unit 203, based on the count values of the timing control counters 503 and 504 in accordance with a setting signal supplied from the resistor controller 501. Also, the control signal generator 505 generates a signal that controls the timing control counter 506. The timing control counter 506 operates based on the count values of the timing control counters 503 and 504 in accordance with a control signal supplied from the control signal generator 502. The control signal generator 507 generates control signals that control the converter 204 and the data processor 106, based on the count value of the timing control counter 506 in accordance with a setting signal supplied from the resistor controller 501.

Next, a method of driving the photoelectric conversion device 100 according to the embodiment will be explained. FIGS. 7A to 7D are timing charts showing an example of the operation of the column A/D converter 105. In the embodiment, signals of the pixels 201 arranged on four rows on each pixel column are simultaneously read out in the photoelectric conversion device 100. The selection circuit 223 sequentially selects a signal output from one pixel 201 out of the simultaneously readout analog signals of the four pixels 201, and outputs the signal to the converter 204. The converter 204 A/D-converts the analog signals output from the selection circuit 223, and sequentially outputs the signals for each pixel of each row. In the following description, as shown in FIG. 3, a circuit represented by SH1_# in the holding circuit 213 will be sometimes called a sample-and-hold circuit SH1, and a circuit represented by SH2_# will be sometimes called a sample-and-hold circuit SH2. The timing control counter 503 is used to control the sample-and-hold circuit SH1, and the timing control counter 504 is used to control the sample-and-hold circuit SH2, which will be described later.

At time T1, the CPU 101 supplies the horizontal sync signal HD to the controller 102. The control signal generator 502 resets the timing control counter 503 to an initial value (for example, 0) based on the horizontal sync signal HD. At this time, the control signal generator 502 does not initialize the timing control counter 504. At time T2, in accordance with the horizontal sync signal HD output from the CPU 101, the control signal generator 502 resets the timing control counter 504 to an initial value (for example, 0) without initializing the timing control counter 503. At time T3, in accordance with the horizontal sync signal HD output from the CPU 101, the control signal generator 502 initializes the timing control counter 503 without initializing the timing control counter 504. At time T4, in accordance with the horizontal sync signal HD output from the CPU 101, the control signal generator 502 initializes the timing control counter 504 without initializing the timing control counter 503. In this manner, the timing control counters 503 and 504 are alternately initialized and operate every time the horizontal sync signal HD is input.

At time T1*n*, the sample-and-hold circuit SH1 starts sampling the level (N signal) of the output line 202 before reading out signals from the photoelectric converters 311 and 313 of the pixel 201, and ends the sampling after a sample time Tsmpl_n. Then, the row selector 103 causes four pixels 201 that are connected to four different output lines 202 arranged on each pixel column and arranged on different rows, to output analog signals based on the signal of the photoelectric converter 311. In response to this, at time T1*s*1, the sample-and-hold circuit SH1 starts sampling a focus detection signal S1 based on the signal of the photoelectric converter 311 that is read out from the pixel portion 104, and ends the sampling after a sample time Tsmpl_s1. After the end of sampling the signal S1, the row selector 103 causes the four pixels 201 for which the signal S1 is sampled, to output analog signals based on the signals of the photoelectric converters 311 and 313. In response to this, at time T1*s*2, the sample-and-hold circuit SH1 starts sampling an image generation signal S2 based on the signals of the photoelectric converters 311 and 313 that are read out from the pixel portion 104, and ends the sampling after a sample time Tsmpl_s2. The sample-and-hold circuit SH1 is in the hold state from time T2 to time T3, and holds the sampled signals.

At time T3, the horizontal sync signal HD is input, the timing control counter 503 is initialized, and the sample-and-hold circuit SH1 changes to the sample state again. At time T3*n*, the sample-and-hold circuit SH1 samples the signal S1 at time T3*s*1 and the signal S2 at time T3*s*2, and at time T4, changes to the hold state.

At time T2*n*, the sample-and-hold circuit SH2 starts sampling the level (N signal) of the output line 202 before reading out signals from the photoelectric converters 311 and 313 of the pixel 201, and ends the sampling after the sample time Tsmpl_n. Then, the row selector 103 causes four pixels 201 that are connected to four different output lines 202 arranged on each pixel column and arranged on different rows, to output analog signals based on the signal of the photoelectric converter 311. For example, when the above-described sample-and-hold circuit SH1 samples signals output from the pixels 201 on the first to fourth rows, the sample-and-hold circuit SH2 can sample signals output from the pixels 201 on the fifth to eighth rows. In response to this, at time T2*s*1, the sample-and-hold circuit SH2 starts sampling the focus detection signal S1 based on the signal of the photoelectric converter 311 that is read out from the pixel portion 104, and ends the sampling after the sample time Tsmpl_s1. After the end of sampling the signal S1, the row selector 103 causes the four pixels 201 (for example, the pixels 201 on the fifth to eighth rows) for which the signal S1 is sampled, to output analog signals based on the signals of the photoelectric converters 311 and 313. In response to this, at time T2*s*2, the sample-and-hold circuit SH2 starts sampling the image generation signal S2 based on the signals of the photoelectric converters 311 and 313 that are read out from the pixel portion 104, and ends the sampling after the sample time Tsmpl_s2. The sample-and-hold circuit SH2 is in the hold state from time T3 to time T4, and holds the sampled signals.

When the sample-and-hold circuit SH1 is in the hold state, the sample-and-hold circuit SH2 performs sampling of signals, and when the sample-and-hold circuit SH2 is in the hold state, the sample-and-hold circuit SH1 performs sampling of signals. That is, the sample-and-hold circuits SH1 and SH2 alternately repeat the operation of sampling and holding signals every time the horizontal sync signal HD is input. Here, one cycle among cycles in which the horizontal sync signal HD is repetitively input will be called one horizontal period Thd. In this case, the holding circuit 213 includes the sample-and-hold circuit SH1 that receives analog signals based on the signal of the photoelectric converter 311 and analog signals based on the signals of the photoelectric converters 311 and 313 in a given horizontal period, and the sample-and-hold circuit SH2 that receives analog signals based on the signal of the photoelectric converter 311 and analog signals based on the signals of the photoelectric converters 311 and 313 in a horizontal period subsequent to the given horizontal period.

At time T2*ad*1 when the value of the timing control counter 503 changes to a set value cnt_ad1, the control signal generator 505 resets the timing control counter 506 to an initial value (for example, 0). At the same time, the control signal generator 507 generates a signal by which the selection circuit 223 selects one sample-and-hold circuit from eight sample-and-hold circuits SH1_#. In accordance with the control signal generated by the control signal generator 507, the selection circuit 223 selects a sample-and-hold circuit and outputs held analog signals to the converter 204. The converter 204 converts the analog signals output from the signal holding unit 203 (selection circuit 223) into digital signals.

Similarly, at time T2*ad*2 when the value of the timing control counter 503 changes to a set value cnt_ad2, the control signal generator 505 resets the timing control counter 506 to the initial value (for example, 0). Also, the control signal generator 507 generates a signal by which the selection circuit 223 selects one sample-and-hold circuit from the eight sample-and-hold circuits SH1_#. Then, the selection circuit 223 selects one sample-and-hold circuit from the sample-and-hold circuits SH1_#, and outputs held analog signals to the converter 204. The converter 204 performs A/D conversion. This also applies to time T2*ad*3 to time T2*ad*8.

In the timing charts shown in FIGS. 7A to 7D, at time T2*ad*1, the selection circuit 223 selects the sample-and-hold circuit SH1_1 (S1). In response to this, the focus detection signal S1 output to cm_vl1 out of the output lines 202 is output to the converter 204 and A/D-converted. Similarly, the focus detection signal S1 output to cm_vl2 out of the output lines 202 is selected at time T2*ad*2, the focus detection signal S1 output to cm_vl3 out of the output lines 202 is selected at time T2*ad*3, and the focus detection signal S1 output to cm_vl4 out of the output lines 202 is selected at time T2*ad*4. The focus detection signals S1 are respectively A/D-converted.

Then, at time T2*ad*5, the selection circuit 223 selects the sample-and-hold circuit SH1_1 (S2). In response to this, the image generation signal S2 output to cm_vl1 out of the output lines 202 is output to the converter 204 and A/D-converted. Similarly, the image generation signal S2 output to cm_vl2 out of the output lines 202 is selected at time T2*ad*6, the image generation signal S2 output to cm_vl3 out of the output lines 202 is selected at time T2*ad*7, and the image generation signal S2 output to cm_vl4 out of the output lines 202 is selected at time T2*ad*8. The image generation signals S2 are respectively A/D-converted.

At this time, the sample-and-hold circuit SH2 performs sampling of signals and holds them. That is, every time the horizontal sync signal HD is input, the converter 204 switches signals held by the sample-and-hold circuits SH1 and SH2, and A/D-converts them. In a given horizontal period Thd, the selection circuit 223 selects analog signals supplied to the sample-and-hold circuit SH1 in a horizontal period Thd immediately preceding the given horizontal period Thd, and outputs them to the converter 204. In a horizontal period Thd succeeding the horizontal period Thd, the selection circuit 223 selects analog signals supplied to the sample-and-hold circuit SH2 in the horizontal period Thd, and outputs them to the converter 204. In the timing charts shown in FIGS. 7A to 7D, the converter 204 performs A/D conversion of the focus detection signal S1 four times and A/D conversion of the image generation signal S2 four times, that is, performs A/D conversion a total of eight times in time division.

The data processor 106 performs black level correction and the like on the A/D-converted digital signals, and outputs them to the signal output unit 107. In the above-described way, data of four rows that are simultaneously read out in a given horizontal period Thd are A/D-converted for each row, and output for each pixel of each row from the photoelectric conversion device 100 via the signal output unit 107.

Next, a method of driving the photoelectric conversion device 100 according to the embodiment will be explained with reference to FIGS. 8A to 8D. FIGS. 8A to 8D are timing charts showing an example of the operation of the column A/D converter 105 when some of the focus detection signals S1 are not A/D-converted. The operation of the holding circuit 213 (sample-and-hold circuits SH1 and SH2) in the signal holding unit 203 is the same as the operation shown in FIGS. 7A to 7D. However, the operation shown in FIGS. 8A to 8D is different from the operation shown in FIGS. 7A to 7D in the operation of the selection circuit 223 in the signal holding unit 203. The following description focuses on the difference, and a description of similar points will be omitted properly.

Similar to the operation shown in FIGS. 7A to 7D, at time T1 and time T2, the sample-and-hold circuit SH1 samples the focus detection signal S1 serving as an analog signal based on the signal of the photoelectric converter 311, and the image generation signal S2 serving as an analog signal based on the signals of the photoelectric converters 311 and 313. At time T2, the sample-and-hold circuit SH1 changes to the hold state.

At time T2*ad*1 when the timing control counter 503 changes to the set value cnt_ad1, the control signal generator 507 generates a signal by which the selection circuit 223 selects the sample-and-hold circuit SH1_1 (S1). Thus, the selection circuit 223 selects the sample-and-hold circuit SH1_1 (S1) holding the focus detection signal S1 output to cm_vl1 out of the output lines 202, and outputs the signal to the converter 204. The converter 204 A/D-converts the signal held by the sample-and-hold circuit SH1_1 (S1). Similarly, at time T2*ad*3, the selection circuit 223 selects the sample-and-hold circuit SH1_3 (S1) holding the focus detection signal S1 output to cm_vl3 out of the output lines 202, and outputs the signal to the converter 204. The converter 204 A/D-converts the signal held by the sample-and-hold circuit SH1_3 (S1).

Similar to the operation shown in FIGS. 7A to 7D, at time T2*ad*5, the selection circuit 223 selects the sample-and-hold circuit SH1_1 (S2). Then, the image generation signal S2 output to cm_vl1 out of the output lines 202 is output to the signal to the converter 204 and A/D-converted. Similarly, the image generation signal S2 output to cm_vl2 out of the output lines 202 is selected at time T2*ad*6, the image generation signal S2 output to cm_vl3 out of the output lines 202 is selected at time T2*ad*7, and the image generation signal S2 output to cm_vl4 out of the output lines 202 is selected at time T2*ad*8. The image generation signals S2 are respectively A/D-converted.

As for a signal sampled by the sample-and-hold circuit SH2, an operation similar to that for a signal sampled by the sample-and-hold circuit SH1 is performed, as shown in FIGS. 8A to 8D. In the timing charts shown in FIGS. 8A to 8D, A/D conversion of the focus detection signal S1 is performed two times during one horizontal period Thd, and A/D conversion of the image generation signal S2 is performed four times. That is, A/D conversion is performed a total of six times in one horizontal period Thd.

The operation of the holding circuit 213 (sample-and-hold circuits SH1 and SH2) in the signal holding unit 203, and the operation of the converter 204 every A/D conversion are the same. However, the number of focus detection analog signals (signals S1) output by the selection circuit 223 to the converter 204 is smaller than that of focus detection analog signals (signals S1) supplied to the holding circuit 213. Hence, the number of focus detection analog signals (signals S1) converted into digital signals by the converter 204 becomes smaller than that of focus detection analog signals (signals S1) supplied to the holding circuit 213. At this time, as shown in FIGS. 8A to 8D, the number of image generation analog signals output by the selection circuit 223 to the converter 204 may be equal to that of image generation analog signals supplied to the holding circuit 213. As a result, the number of times of A/D conversion in the converter 204 becomes smaller than that in the operation shown in FIGS. 7A to 7D, reducing the power consumption of the photoelectric conversion device 100 in one horizontal period Thd.

In the operation shown in FIGS. 8A to 8D, the converter 204 stands by at the timing of A/D conversion of the focus detection signal S1 thinned out from the operation shown in FIGS. 7A to 7D. However, the selection circuit 223 may select the sample-and-hold circuit SH1_3 (S1) at time T2*ad*2. Alternatively, for example, the selection circuit 223 may select the sample-and-hold circuit SH1_1 (S1) at time T2*ad*2, and select the sample-and-hold circuit SH1_3 (S1) at time T2*ad*3. Alternatively, for example, the selection circuit 223 may select the sample-and-hold circuit SH1_1 (S1) at time T2*ad*3, and select the sample-and-hold circuit SH1_3 (S1) at time T2*ad*4. Further, for example, the selection circuit 223 may select the sample-and-hold circuit SH1_1 (S1) at time T2*ad*1, and select the sample-and-hold circuit SH1_3 (S1) at time T2*ad*4.

The photoelectric conversion device 100 according to the embodiment includes the above-mentioned signal holding unit 203. This can implement the same operation in vertical scanning of the pixels 201 regardless of whether which of the operation shown in FIGS. 8A to 8D in which A/D conversion of the focus detection signal S1 is reduced, and the operation shown in FIGS. 7A to 7D in which all the focus detection signals S1 are A/D-converted is performed. That is, the operation of the row selector 103 and that of the holding circuit 213 (sample-and-hold circuits SH1 and SH2) do not change between the operation shown in FIGS. 7A to 7D and the operation shown in FIGS. 8A to 8D. Therefore, the time for each output line 202 until signals from the pixels 201 are output to the converter 204 after readout to the holding circuit 213 (sample-and-hold circuits SH1 and SH2) does not change regardless of whether to thin out A/D conversion of the focus detection signal S1.

For example, a case where the signal holding unit 203 is not arranged and the time until signals from the pixels 201 are A/D-converted after readout changes depending on the operation will be considered. For example, when the signals S1 output to the second and third output lines 202 out of signals output to four output lines 202 are thinned out, the signal S1 of the fourth output line 202 may be sent to the converter 204 immediately after A/D conversion of the signal S1 of the first output line 202. To the contrary, when the signals S1 are not thinned out, the signal S1 of the fourth output line 202 is sent to the converter 204 after the end of A/D conversion of the signals S1 of the first to third output lines 202, and the time until the signal S1 is A/D-converted after output to the output line 202 changes. In a case where the holding circuit 213 (sample-and-hold circuits SH1 and SH2) is not arranged, the precision of A/D conversion may decrease owing to a temporal change of the signal level caused by leakage of the output line 202. To the contrary, in the embodiment, the signal holding unit 203 can suppress such a decrease in A/D conversion precision.

As described above, the operation of the row selector 103 and that of the holding circuit 213 (sample-and-hold circuits SH1 and SH2) do not change between the operation shown in FIGS. 7A to 7D and the operation shown in FIGS. 8A to 8D. When the operation shown in FIGS. 7A to 7D and the operation shown in FIGS. 8A to 8D are switched and used in accordance with the focus detection precision or the like, the controller 102 can control the operation of the row selector 103 and that of the holding circuit 213 using the same control signal. That is, a control signal output from the controller 102 can be easily designed.

In the operation shown in FIGS. 8A to 8D, A/D conversion of half of the focus detection signals S1 is thinned out. However, the embodiment is not limited to this, and one signal S1 or three signals S1 may be thinned out. It only suffices to thin out a proper number of signals S1 in accordance with shooting conditions, a precision necessary for focus detection, or the like. The photoelectric conversion device 100 may be so constituted as to appropriately set the number (ratio) of signals S1 to be thinned out in accordance with shooting conditions, a precision necessary for focus detection, or the like. The number (ratio) of signals S1 to be thinned out may be properly set by the user, or automatically set in accordance with shooting conditions or the like.

As described above, in the photoelectric conversion device 100 according to the embodiment, proper signals out of signals held by the holding circuit 213 (sample-and-hold circuits SH1 and SH2) can be selected by the selection circuit 223 and output to the converter 204. This can implement not only high-speed shooting, but also reduction of power consumption by decreasing the number of times of A/D conversion. Selecting proper signals can suppress a decrease in focus detection precision. As a result, the performance of the photoelectric conversion device 100 improves.

In the operation shown in FIGS. 8A to 8D, the holding circuit 213 (sample-and-hold circuits SH1 and SH2) holds all the supplied focus detection signals S1, and the selection circuit 223 selects some of the focus detection signals S1 held by the holding circuit 213 and outputs them to the converter 204. However, the embodiment is not limited to this. For example, the holding circuit 213 may hold some of the supplied focus detection signals S1, and the selection circuit 223 may select the held signals S1 and supply them to the converter 204. For example, when analog signals based on the signals of the photoelectric converters 311 of the pixels 201 are output to the output lines 202, the holding circuit 213 (sample-and-hold circuits SH1 and SH2) need not hold signals to be thinned out.

Next, a modification of the operation shown in FIGS. 8A to 8D will be explained with reference to FIGS. 9A to 9D. FIGS. 9A to 9D are timing charts showing an example of the operation of the column A/D converter 105 when some of the focus detection signals S1 are not A/D-converted, similar to the operation shown in FIGS. 8A to 8D. The operation of the holding circuit 213 (sample-and-hold circuits SH1 and SH2) in the signal holding unit 203 is the same as those shown in FIGS. 7 and 8. However, the operation shown in FIGS. 9A to 9D is different from the operation shown in FIGS. 8A to 8D in the operation of the selection circuit 223 in the signal holding unit 203. The following description focuses on the difference, and a description of similar points will be omitted properly.

In the operation shown in FIGS. 8A to 8D, the total numbers of focus detection signals S1 and image generation signals S2 output by the selection circuit 223 to the converter 204 in a given horizontal period Thd are equal to those of focus detection signals S1 and image generation signals S2 output by the selection circuit 223 to the converter 204 in a horizontal period Thd subsequent to the given horizontal period Thd. In other words, the total numbers of focus detection signals S1 and image generation signals S2 that are selected by the selection circuit 223 from signals held by the sample-and-hold circuit SH1 and output to the converter 204 are equal to those of focus detection signals S1 and image generation signals S2 that are selected by the selection circuit 223 from signals held by the sample-and-hold circuit SH2 and output to the converter 204. That is, the same numbers of focus detection signals S1 and image generation signals S2 are supplied to the converter 204 every horizontal period Thd.

In contrast, in the operation shown in FIGS. 9A to 9D, the total numbers of focus detection signals S1 and image generation signals S2 output by the selection circuit 223 to the converter 204 in a given horizontal period Thd are different from those of focus detection signals S1 and image generation signals S2 output by the selection circuit 223 to the converter 204 in a horizontal period Thd subsequent to the given horizontal period Thd. That is, different numbers of focus detection signals S1 and image generation signals S2 are supplied to the converter 204 every horizontal period Thd (for example, alternately).

Even in the operation shown in FIGS. 9A to 9D, similar to the operation shown in FIGS. 7A to 7D, the sample-and-hold circuit SH1 samples at time T1 and time T2 the focus detection signal S1 serving as an analog signal based on the signal of the photoelectric converter 311 and the image generation signal S2 serving as an analog signal based on the signals of the photoelectric converters 311 and 313. Then, the sample-and-hold circuit SH1 changes to the hold state at time T2.

At time T2*ad*5 when the timing control counter 503 changes to the set value cnt_ad5, the control signal generator 507 generates a signal by which the selection circuit 223 selects the sample-and-hold circuit SH1_1 (S2). In response to this, the selection circuit 223 selects the sample-and-hold circuit SH1_1 (S2) holding the image generation signal S2 output to cm_vl1 out of the output lines 202, and outputs the signal to the converter 204. The converter 204 A/D-converts the signal held by the sample-and-hold circuit SH1_1 (S2). Similarly, the image generation signal S2 output to cm_vl2 out of the output lines 202 is selected at time T2*ad*6, the image generation signal S2 output to cm_vl3 out of the output lines 202 is selected at time T2*ad*7, and the image generation signal S2 output to cm_vl4 out of the output lines 202 is selected at time T2*ad*8. The image generation signals S2 are respectively A/D-converted.

In this fashion, the selection circuit 223 does not output the focus detection signal S1 to the converter 204 at time T2 and time T3. The focus detection signal S1 supplied to the sample-and-hold circuit SH1 is not A/D-converted by the converter 204.

At time T2 and time T3, the sample-and-hold circuit SH2 samples the focus detection signal S1 serving as an analog signal based on the signal of the photoelectric converter 311 and the image generation signal S2 serving as an analog signal based on the signals of the photoelectric converters 311 and 313. At time T3, the sample-and-hold circuit SH2 changes to the hold state.

At time T3*ad*1 when the timing control counter 504 changes to the set value cnt_ad1, the selection circuit 223 selects the sample-and-hold circuit SH2_1(S1). In response to this, the focus detection signal S1 output to cm_vl1 out of the output lines 202 is output to the converter 204 and A/D-converted. Similarly, the focus detection signal S1 output to cm_vl2 out of the output lines 202 is selected at time T3*ad*2, the focus detection signal S1 output to cm_vl3 out of the output lines 202 is selected at time T3*ad*3, and the focus detection signal S1 output to cm_vl4 out of the output lines 202 is selected at time T3*ad*4. The focus detection signals S1 are respectively A/D-converted.

Then, at time T3*ad*5 when the timing control counter 504 changes to the set value cnt_ad5, the selection circuit 223 selects the sample-and-hold circuit SH2_1 (S2). Then, the image generation signal S2 output to cm_vl1 out of the output lines 202 is output to the converter 204 and A/D-converted. Similarly, the image generation signal S2 output to cm_vl2 out of the output lines 202 is selected at time T3*ad*6, the image generation signal S2 output to cm_vl3 out of the output lines 202 is selected at time T3*ad*7, and the image generation signal S2 output to cm_vl4 out of the output lines 202 is selected at time T3*ad*8. The image generation signals S2 are respectively A/D-converted.

In this manner, at time T3 and time T4, the selection circuit 223 outputs to the converter 204 all the focus detection signals S1 and image generation signals S2 held by the sample-and-hold circuit SH2. Hence, the converter 204 A/D-converts all the focus detection signals S1 and the image generation signals S2 that are supplied to the sample-and-hold circuit SH2. In the hold period between time T3 and time T4, the converter 204 A/D-converts all the focus detection signals (S1) and the image generation signals (S2).

In the operation shown in FIGS. 9A to 9D, only the image generation signals S2 are A/D-converted without A/D-converting the focus detection signals S1 supplied to the sample-and-hold circuit SH1. The focus detection signals S1 and the image generation signals S2 that are supplied to the sample-and-hold circuit SH2 are A/D-converted. In the operation shown in FIGS. 8A to 8D, whether to A/D-convert the focus detection signal S1 is switched between the hold period of the sample-and-hold circuit SH1 and that of the sample-and-hold circuit SH2.

In the operation shown in FIGS. 9A to 9D, A/D conversion of the focus detection signal S1 is performed four times, and A/D conversion of the image generation signal S2 is performed eight times in a period double the horizontal period Thd. That is, A/D conversion is performed a total of 12 times in a period double the horizontal period Thd. Since A/D conversion is performed a total of 16 times in a period double the horizontal period Thd in the operation shown in FIGS. 7A to 7D, the number of times of A/D conversion in the operation shown in FIGS. 9A to 9D is smaller than that in the operation shown in FIGS. 7A to 7D.

Even in the operation shown in FIGS. 9A to 9D, the operation of the holding circuit 213 (sample-and-hold circuits SH1 and SH2) in the signal holding unit 203, and the operation of the converter 204 every A/D conversion are the same. However, the number of focus detection analog signals (signals S1) output by the selection circuit 223 to the converter 204 is smaller than that of focus detection analog signals (signals S1) supplied to the holding circuit 213. Thus, the number of focus detection analog signals (signals S1) converted into digital signals by the converter 204 becomes smaller than that of focus detection analog signals (signals S1) supplied to the holding circuit 213. As a result, the number of times of A/D conversion in the converter 204 becomes smaller than that in the operation shown in FIGS. 7A to 7D, reducing the power consumption of the photoelectric conversion device 100.

In the operation shown in FIGS. 9A to 9D, the focus detection signal S1 supplied to the sample-and-hold circuit SH1 is not A/D-converted. However, the embodiment is not limited to this, and the focus detection signal S1 supplied to the sample-and-hold circuit SH1 may be A/D-converted without A/D-converting the focus detection signal S1 supplied to the sample-and-hold circuit SH2.

Alternatively, some of the focus detection signals S1 supplied to the sample-and-hold circuit SH1 may be A/D-converted in accordance with shooting conditions, a precision necessary for focus detection, or the like. Similar to the operation shown in FIGS. 8A to 8D, it is only necessary to thin out a proper number of signals S1 in accordance with shooting conditions, a precision necessary for focus detection, or the like.

Even in the operation shown in FIGS. 9A to 9D, the photoelectric conversion device 100 according to the embodiment can use the selection circuit 223 to select proper signals out of signals held by the holding circuit 213 (sample-and-hold circuits SH1 and SH2) and output them to the converter 204. This can implement not only high-speed shooting, but also reduction of power consumption by decreasing the number of times of A/D conversion. Selecting proper signals can suppress a decrease in focus detection precision. Therefore, the performance of the photoelectric conversion device 100 improves.

Although the plurality of output lines 202 are provided for one column of pixels in the embodiment, the arrangement is not limited to this. For example, only one output line 202 may be arranged for one column of pixels. Even in this case, the selection circuit 223 is provided to select some output lines 202 from the plurality of output lines 202, that is, the plurality of output lines 202 arranged in correspondence with a plurality of columns of pixels, and output signals to the holding circuit 213. Even in this form, the operations according to the embodiment respectively shown in FIGS. 7 to 9 can be performed.

Figure 10:
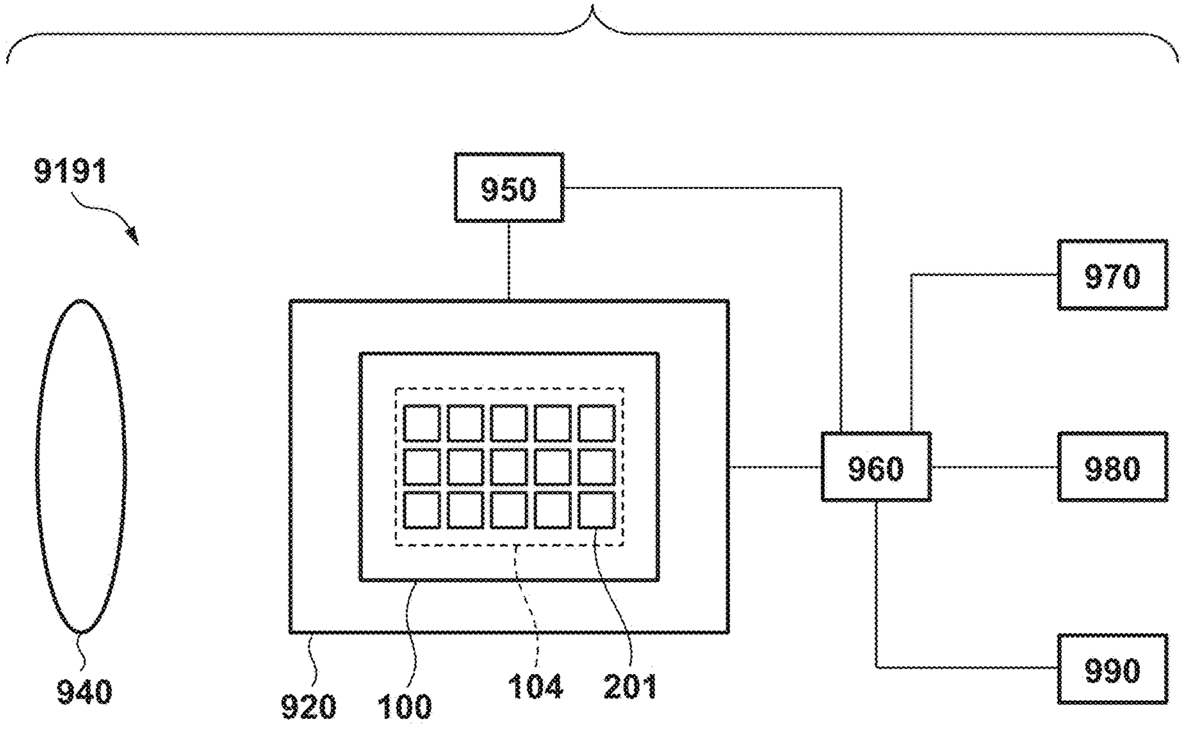
FIG. 10 is a view showing an example of the arrangement of an apparatus incorporating the photoelectric conversion device in FIG. 1.

An application example of the photoelectric conversion device 100 according to the embodiment will be explained with reference to FIG. 10. FIG. 10 is a schematic view of an apparatus 9191 including the photoelectric conversion device 100. As shown in FIG. 10, the photoelectric conversion device 100 is housed in a package 920. The package 920 can include a base to which the photoelectric conversion device 100 is fixed, and a lid such as glass facing the photoelectric conversion device 100. The package 920 can further include joint members such as bonding wires and bumps that connect terminals provided on the base and pads provided on the photoelectric conversion device 100.

The apparatus 9191 can include at least one of an optical device 940, a control device 950, a processing device 960, a display device 970, a storage device 980, and a mechanical device 990. The optical device 940 is implemented by, for example, a lens, a shutter, and a mirror. The control device 950 controls the photoelectric conversion device 100. The control device 950 is, for example, a semiconductor device such as an ASIC.

The processing device 960 processes a signal output from the photoelectric conversion device 100. The processing device 960 is a semiconductor device such as a CPU or an ASIC for forming an analog front end (AFE) or a digital front end (DFE). The display device 970 is an EL display device or a liquid crystal display device that displays information (image) obtained by the photoelectric conversion device 100. The storage device 980 is a magnetic device or a semiconductor device that stores the information (image) obtained by the photoelectric conversion device 100. The storage device 980 is a volatile memory such as an SRAM or a DRAM, or a nonvolatile memory such as a flash memory or a hard disk drive.

The mechanical device 990 includes a moving or propulsion unit such as a motor or an engine. In the apparatus 9191, the signal output from the photoelectric conversion device 100 is displayed on the display device 970 or transmitted to an external device by a communication device (not shown) included in the apparatus 9191. Hence, the apparatus 9191 may further include the storage device 980 and the processing device 960 in addition to the memory circuits and arithmetic circuits included in the photoelectric conversion device 100. The mechanical device 990 may be controlled based on the signal output from the photoelectric conversion device 100.

In addition, the apparatus 9191 is suitable for an electronic apparatus such as an information terminal (for example, a smartphone or a wearable terminal) which has a shooting function or a camera (for example, an interchangeable lens camera, a compact camera, a video camera, or a monitoring camera). The mechanical device 990 in the camera can drive the components of the optical device 940 in order to perform zooming, an in-focus operation, and a shutter operation. Alternatively, the mechanical device 990 in the camera can move the photoelectric conversion device 100 in order to perform an anti-vibration operation.

Furthermore, the apparatus 9191 can also be applied to an onboard camera mounted in a transportation apparatus such as a vehicle, a ship, an airplane, or an industrial robot. The mechanical device 990 in the transportation apparatus can be used as a moving device. The apparatus 9191 as the transportation apparatus is suitable for a device that transports the photoelectric conversion device 100 or a device that uses an image capturing function to assist and/or automate driving (steering). The processing device 960 for assisting and/or automating driving (steering) can perform, based on the information obtained by the photoelectric conversion device 100, processing for operating the mechanical device 990 as a moving device. The apparatus 9191 incorporating the photoelectric conversion device 100 can be widely applied to an apparatus using object recognition such as an intelligent transport system (ITS), in addition to the transportation apparatus. Alternatively, the apparatus 9191 may be a medical apparatus such as an endoscope, a measurement apparatus such as a distance measurement sensor, an analysis device such as an electron microscope, or an office apparatus such as a copy machine.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2024-032522, filed Mar. 4, 2024, which is hereby incorporated by reference herein in its entirety.

What is claimed is:

1. A photoelectric conversion device comprising: a plurality of pixels arranged to constitute a plurality of rows and a plurality of columns; a plurality of output lines; and a row selector configured to select, from the plurality of pixels, a pixel that outputs a signal, wherein a signal holding unit, and a converter configured to convert an analog signal output from the signal holding unit into a digital signal are arranged for each column of the plurality of columns, the signal holding unit includes a holding circuit configured to receive signals from pixels connected to at least two output lines out of the plurality of pixels via, out of the plurality of output lines, the at least two output lines assigned to the column on which the signal holding unit is arranged, and a selection circuit, each of the plurality of pixels includes a first photoelectric converter and a second photoelectric converter, the row selector causes at least two pixels that are connected to different output lines out of the at least two output lines and arranged on different rows out of the plurality of rows, to output first analog signals based on a signal of the first photoelectric converter, and then output second analog signals based on a signal of the first photoelectric converter and a signal of the second photoelectric converter, the selection circuit selects the first analog signals and the second analog signals that are held by the holding circuit, and outputs the first analog signals and the second analog signals to the converter, and a number of the first analog signals output by the selection circuit to the converter is smaller than a number of the first analog signals supplied to the holding circuit.

2. The device according to claim 1, wherein the plurality of output lines are provided to assign at least two output lines to each column of the plurality of columns.

3. The device according to claim 1, wherein a number of the second analog signals output by the selection circuit to the converter is equal to a number of the second analog signals supplied to the holding circuit.

4. The device according to claim 1, wherein a number of the first analog signals converted into digital signals by the converter is smaller than a number of the first analog signals supplied to the holding circuit.

5. The device according to claim 1, wherein the holding circuit includes a first holding circuit configured to receive the first analog signal and the second analog signal in a first horizontal period, and a second holding circuit configured to receive the first analog signal and the second analog signal in a second horizontal period subsequent to the first horizontal period, and in the second horizontal period, the selection circuit selects the first analog signal and the second analog signal that are supplied to the first holding circuit in the first horizontal period, and outputs the first analog signal and the second analog signal to the converter, and in a third horizontal period subsequent to the second horizontal period, selects the first analog signal and the second analog signal that are supplied to the second holding circuit in the second horizontal period, and outputs the first analog signal and the second analog signal to the converter.

6. The device according to claim 5, wherein total numbers of the first analog signals and the second analog signals that are output by the selection circuit to the converter in the second horizontal period are equal to total numbers of the first analog signals and the second analog signals that are output by the selection circuit to the converter in the third horizontal period.

7. The device according to claim 5, wherein total numbers of the first analog signals and the second analog signals that are output by the selection circuit to the converter in the second horizontal period are different from total numbers of the first analog signals and the second analog signals that are output by the selection circuit to the converter in the third horizontal period.

8. The device according to claim 7, wherein the selection circuit does not output the first analog signal to the converter in the second horizontal period.

9. The device according to claim 8, wherein in the third horizontal period, the selection circuit supplies, to the converter, all the first analog signals that are supplied to the second holding circuit in the second horizontal period.

10. The device according to claim 1, wherein the converter converts, into digital signals in time division, the first analog signal and the second analog signal that are output from the selection circuit.

11. The device according to claim 1, wherein the first analog signal is a focus detection signal, and the second analog signal is an image generation signal.

12. The device according to claim 1, wherein each of the plurality of pixels includes a microlens, and the first photoelectric converter and second photoelectric converter of each of the plurality of pixels are arranged in correspondence with one microlens.

13. The device according to claim 2, wherein each of the plurality of pixels includes a microlens, and the first photoelectric converter and second photoelectric converter of each of the plurality of pixels are arranged in correspondence with one microlens.

14. The device according to claim 1, wherein the holding circuit holds some of the supplied first analog signals, and the selection circuit selects the some of the first analog signals and supplies the some of the first analog signals to the converter.

15. The device according to claim 1, wherein the holding circuit holds all the supplied first analog signals, and the selection circuit selects some of the first analog signals held by the holding circuit, and supplies the some of the first analog signals to the converter.

16. An apparatus comprising:

the photoelectric conversion device according to claim 1; and a processing device configured to process a signal output from the photoelectric conversion device.

* * * * *